(12) United States Patent
del Puerto et al.

(10) Patent No.: US 7,830,497 B2
(45) Date of Patent: Nov. 9, 2010

(54) SYSTEM AND METHOD FOR USING A TWO PART COVER AND A BOX FOR PROTECTING A RETICLE

(75) Inventors: Santiago del Puerto, Milton, NY (US); Erik R. Loopstra, Heeze (NL); Andrew Massar, Monroe, CT (US); Duane P. Kish, Danbury, CT (US); Abdullah Alikhan, Danbury, CT (US); Woodrow J. Olsen, Stamford, CT (US); Jonathan H. Feroce, Shelton, CT (US)

(73) Assignee: ASML Holding N.V., Veldhoven (NL)

( * ) Notice: Subject to any disclaimer, the term of this patent is extended or adjusted under 35 U.S.C. 154(b) by 353 days.

(21) Appl. No.: 11/785,548

(22) Filed: Apr. 18, 2007

(65) Prior Publication Data

US 2007/0258061 A1 Nov. 8, 2007

Related U.S. Application Data

(62) Division of application No. 11/299,787, filed on Dec. 13, 2005, now Pat. No. 7,209,220, which is a division of application No. 10/369,108, filed on Feb. 20, 2003, now Pat. No. 7,304,720.

(60) Provisional application No. 60/414,358, filed on Sep. 30, 2002, provisional application No. 60/358,354, filed on Feb. 22, 2002, provisional application No. 60/364,129, filed on Mar. 15, 2002.

(51) Int. Cl.
*G03B 27/32* (2006.01)
*G03B 27/52* (2006.01)
*G03B 27/62* (2006.01)

(52) U.S. Cl. .................................. 355/77; 35/30; 35/75
(58) Field of Classification Search .................. 355/75, 355/72, 53; 378/34, 35; 206/710, 454; 353/114
See application file for complete search history.

(56) References Cited

U.S. PATENT DOCUMENTS 3,615,006 A 10/1971 Freed (Continued)

FOREIGN PATENT DOCUMENTS

EP 0 525 293 A1 2/1993

(Continued)

OTHER PUBLICATIONS

Office Action (and English translation) from Korean Patent Appln. No. 2007-0018542, 25 pages, dated Mar. 7, 2008.

(Continued)

*Primary Examiner*—Peter B Kim
(74) *Attorney, Agent, or Firm*—Sterne, Kessler, Goldstein & Fox P.L.L.C.

(57) ABSTRACT

Systems and methods to protect a mask from being contaminated by airborne particles are described. The systems and methods include providing a reticle secured in a two-part cover. The two part cover includes a removable protection device used to protect the reticle from contaminants. The cover can be held inside a pod or box that can be used to transport the cover through a lithography system from an atmospheric section to a vacuum section. While in the vacuum section, the removable cover can be moved during an exposure process during which a pattern on the reticle can be formed on a wafer.

12 Claims, 23 Drawing Sheets

U.S. PATENT DOCUMENTS

| | | | |
|---|---|---|---|
| 4,248,508 | A | 2/1981 | Watkin |
| 4,549,843 | A | 10/1985 | Jagusch et al. |
| 5,308,989 | A | 5/1994 | Brubaker |
| 5,422,704 | A | 6/1995 | Sego |
| 5,611,452 | A | 3/1997 | Bonora et al. |
| 5,964,561 | A | 10/1999 | Marohl |
| 6,055,040 | A | 4/2000 | Sego |
| 6,197,454 | B1 | 3/2001 | Yan |
| 6,216,873 | B1 | 4/2001 | Fosnight et al. |
| 6,224,679 | B1 | 5/2001 | Sasaki et al. |
| 6,239,863 | B1 | 5/2001 | Catey et al. |
| 6,279,249 | B1 | 8/2001 | Dao et al. |
| 6,280,886 | B1 | 8/2001 | Yan |
| 6,317,479 | B1 | 11/2001 | Chiba et al. |
| 6,499,935 | B1 | 12/2002 | Hirakawa et al. |
| 6,566,018 | B2 | 5/2003 | Muzio et al. |
| 6,607,984 | B1 | 8/2003 | Lee et al. |
| 6,630,988 | B2 | 10/2003 | Greene, Jr. et al. |
| 6,646,720 | B2 | 11/2003 | Ramamoorthy et al. |
| 6,715,495 | B2 | 4/2004 | Dao et al. |
| 6,732,746 | B2 | 5/2004 | Dao et al. |
| 6,734,443 | B2 | 5/2004 | Zheng et al. |
| 6,734,445 | B2 | 5/2004 | Ramomoorthy et al. |
| 6,763,608 | B2 | 7/2004 | Dao et al. |
| 6,803,159 | B2 | 10/2004 | Enloe |
| 6,906,783 | B2 | 6/2005 | del Puerto et al. |
| 7,209,220 | B2 | 4/2007 | Puerto et al. |
| 7,304,720 | B2 | 12/2007 | del Puerto et al. |
| 2001/0031404 | A1 | 10/2001 | Caminos et al. |
| 2002/0021781 | A1 | 2/2002 | Chiba et al. |
| 2002/0066692 | A1 | 6/2002 | Smith et al. |
| 2002/0092144 | A1 | 7/2002 | Nguyen et al. |
| 2002/0154285 | A1 | 10/2002 | Ramomoorthy et al. |
| 2002/0155358 | A1 | 10/2002 | Cullins et al. |
| 2003/0082461 | A1 | 5/2003 | Carpi |
| 2003/0218728 | A1 | 11/2003 | del Puerto et al. |

FOREIGN PATENT DOCUMENTS

| | | |
|---|---|---|
| EP | 0 582 018 A1 | 2/1994 |
| EP | 1 341 042 A2 | 9/2003 |
| JP | 56-24335 A | 3/1981 |
| JP | 2-98122 A | 4/1990 |
| JP | 9-306820 A | 11/1997 |
| JP | 9-320935 A | 12/1997 |
| KR | 1999-019435 A | 3/1999 |
| KR | 1999-0025656 A | 7/1999 |
| KR | 20-0195116 B | 9/2000 |

OTHER PUBLICATIONS

Examination Report for Singapore Application No. 200301191-3 mailed May 30, 2008, 3 pgs.

Partial European Search Report for EP Appln. No. EP 03 003 288, mailed Jul. 25, 2003, 3 pages.

European Search Report for EP Appln. 03 003 288.2, mailed Feb. 12, 2004.

Office Action for Chinese Appln. No. 03412306.X, mailed Jun. 10, 2005, 10 pages.

English Translation of JP published application No. 02-98122, dated Apr. 22, 2004.

Office Action (and English translation) for Korean Appln. No. 10-2003-0011231, dated Jul. 25, 2005.

Search Report for Singapore Patent Appln. No. 200301191-3, 6 pages, dated Mar. 30, 2004.

Yoshitake, S. et al., "New Mask Blank Handling System for the Advanced Electron Beam Writer," Proceedings of SPIE: 19th Annual Symposium on Photomask Technology, vol. 3874, Part 2, pp. 905-915, Sep. 1999.

Office Action (and English translation) from Chinese Patent Appln. No. 03142306.X, 6 pages, dated Feb. 10, 2006.

Office Action (and English translation) from Japanese Patent Appln. No. 2003-046630, 5 pages, dated Jul. 11, 2007.

Written Opinion for Singapore Patent Application No. 200301191-3 completed on Aug. 16, 2007, 3 pages.

Office Action and English Translation for Japanese Patent Application No. 2003-046630 drafted on Dec. 4, 2007, 4 pages.

SYSTEM AND METHOD FOR USING A TWO PART COVER AND A BOX FOR PROTECTING A RETICLE

CROSS-REFERENCE TO RELATED APPLICATIONS

This application is a divisional of U.S. application Ser. No. 11/299,787, filed Dec. 13, 2005 (issuing as U.S. Pat. No. 7,209,220 on Apr. 24, 2007), which is a divisional of co-owned, co-pending U.S. application Ser. No. 10/369,108, filed Feb. 20, 2003 (now pending), which claims priority under 35 U.S.C. §119(e) to U.S. Provisional Patent Application Nos. 60/414,358, filed Sep. 30, 2002, 60/364,129 ("the '129 Prov. App."), filed Mar. 15, 2002, and 60/358,354 ("the '354 Prov. App."), filed Feb. 22, 2002, which are all incorporated by reference herein in their entireties.

This application is related to co-owned U.S. Pat. No. 6,906,783 that issued Jun. 14, 2005, which is incorporated by reference herein in its entirety.

This application is also related to co-owned U.S. Pat. No. 6,239,863 ("the '863 patent"), which is incorporated by reference herein in its entirety.

BACKGROUND OF THE INVENTION

1. Field of the Invention

This invention generally relates to lithography, and more specifically to the protection of lithographic reticles without the use of a pellicle.

2. Related Art

Lithography is a process used to create features on a surface of a substrate. The substrate can include those used in the manufacture of flat panel displays, circuit boards, various integrated circuits, and the like. A semiconductor wafer, for example, can be used as a substrate to fabricate an integrated circuit.

During lithography, a reticle is used to transfer a desired pattern onto a substrate. The reticle can be formed of a material transparent to a lithographic wavelength being used, for example glass in the case of visible light. The reticle can also be formed to reflect a lithographic wavelength being used, for example extreme ultraviolet (EUV) light. The reticle has an image printed on it. The size of the reticle is chosen for the specific system in which it is used. A reticle six inches by six inches and one-quarter inch thick may be used, for example. During lithography, a wafer, which is disposed on a wafer stage, is exposed to an image projected onto the surface of the wafer corresponding to the image printed on the reticle.

The projected image produces changes in the characteristics of a layer, for example a photoresist layer, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface of the wafer.

As should be clear from the above discussion, the accurate location and size of features produced through lithography is directly related to the precision and accuracy of the image projected onto the wafer. The rigors of sub-100 nm lithography place stringent demands not only on the lithography tool, but also on the reticle. Airborne particles and dust that settle on the reticle can cause defects on the wafer. Small image distortions or displacements in the reticle plane can be larger than critical dimension and overlay error budgets. A conventional solution is to use a thin piece of permanently fixed transparent material as a pellicle for the reticle.

This pellicle remains in place during all stages of the lithography process. A pellicle has a dual role in improving the accuracy of the image projected onto a wafer. First, a pellicle serves to protect the reticle from direct contact with particulate contamination. As discussed above, particles that settle on the reticle can produce image distortion, so they must be removed. However, removal of particles from the reticle can cause damage to the reticle because such removal may involve direct contact with the reticle. When a pellicle is used, particles will settle on the pellicle rather than the reticle. Thus, it is the pellicle that must be cleaned. Cleaning the pellicle rather than the reticle poses fewer dangers to the integrity of the reticle since the reticle is protected during this cleaning by the pellicle itself.

The second role played by a pellicle is related to the stand-off of the pellicle. During exposure, the focal plane corresponds to the location of the image printed on the reticle. By including a pellicle, any particles in the system will settle on the pellicle rather than the reticle. By virtue of the thickness of the pellicle, and thus the distance between the surface of the pellicle and the patterned surface of the reticle, these particles will not be in the focal plane. Since the pellicle lifts the particles out of the focal plane, the probability that the image projected onto the substrate will include these particles is greatly reduced.

This solution discussed above works well in many conventional lithographic processing techniques. Thus, use of such a system is convenient in a system in which light passes through both the reticle and the pellicle because materials are available for producing transparent pellicles and reticles. The pellicle approach, however, is not well suited for use in EUV applications because the short wavelengths of light being used are easily absorbed when transmitted through gases or solids.

Therefore, currently there are no materials sufficiently transparent to EUV that can be used to make a pellicle. In EUV lithography, the EUV does not pass through the reticle, but is reflected off the image side of the reticle. This technique is known as reflective lithography. If a pellicle were to be used in a reflective lithography process, the EUV would necessarily pass through the pellicle twice, once on the way to the reticle and again after reflecting off of the reticle. Thus, any amount of light loss associated with the pellicle is effectively doubled with EUV processing techniques.

Therefore, what is needed is a system and method that allow for protection of a reticle from contaminants that do not substantially reduce the quality of EUV light passing through the system.

BRIEF SUMMARY OF THE INVENTION

Embodiments of the present invention provide a method for transporting a mask, including the steps of: (a) covering a first portion of a mask with a removable particle cover creating a mask-cover arrangement (b) enclosing the arrangement inside a gas-tight box, having a mask-carrying portion and a lid, separable from the mask-carrying portion, and (c) transporting the arrangement inside the box.

Embodiments of the present invention provide a gas-tight box for transporting a mask, including: a mask-carrying portion, a lid, a gas sealing device, for preventing gas flow between the mask-carrying portion and the lid, and a latch, for temporarily attaching and securing the lid to the mask-carrying portion.

Embodiments of the present invention provide a method for transporting, handling and processing a mask, including the steps of: (a) covering a first portion of a mask with a removable particle cover creating a mask-cover arrangement, (b) enclosing the arrangement inside a gas-tight box, having a mask-carrying portion and a lid, separable from the mask-carrying portion, (c) transporting the box containing the arrangement to a process tool, having at least one of each of the following components: a de-podder, a mini-environment chamber, a mini-environment manipulator, a loadlock, a vacuum chamber, a vacuum manipulator, and a mask mount, (d) placing the box containing the arrangement on a first opening of a de-podder, such that the lid of the box prevents gas flow through the first opening, (e) purging the interior of the de-podder with clean gas, (f) opening the box by separating the mask-carrying portion from the lid, keeping the lid in place, for blocking gas flow, and moving the mask-carrying portion and the arrangement to the interior of the de-podder, (g) extracting the arrangement from the de-podder through a second de-podder opening into a mini-environment chamber, using a mini-environment manipulator and placing the arrangement inside a loadlock through a first loadlock opening, (h) pumping down the loadlock, (i) extracting the arrangement from the loadlock through a second loadlock opening and moving the arrangement to the interior of a vacuum chamber, using a vacuum manipulator, (j) placing the arrangement on a mask mount, such that the uncovered portion of the mask is in contact with the mount, (k) holding the mask with the mount, (l) separating the cover from the mask and taking away the cover, using the vacuum manipulator, and (m) processing the mask.

Embodiments of the present invention provide a loadlock including: an enclosure having at least two openings, an atmospheric-side gate valve coupled to a first opening of the enclosure, a vacuum-side gate valve coupled to a second opening of the enclosure, a mask holder for receiving a mask, located inside the enclosure, a movable dome for covering the mask, located inside the enclosure, and a dome actuator for moving the dome, such that the dome can be positioned to cover the mask.

Embodiments of the present invention provide a method for transitioning a mask from atmospheric pressure to vacuum in a loadlock, including the steps of: (a) placing a mask inside a loadlock, (b) covering the mask with a dome to prevent airborne particles in the loadlock from reaching the mask, (c) closing the loadlock, (d) pumping down the loadlock, (e) opening the loadlock to vacuum, (f) uncovering the mask by withdrawing the dome, and (g) removing the mask from the loadlock.

Embodiments of the present invention provide a method for transporting, handling and processing a mask, including the steps of: (a) enclosing a mask inside a gas-tight box, having a mask-carrying portion and a lid, separable from the mask-carrying portion, (b) transporting the box containing the mask to a process tool, having at least one of each of the following components: a de-podder, a mini-environment chamber, a mini-environment manipulator, a loadlock, a vacuum chamber, a vacuum manipulator and a mask mount, (c) placing the box containing the mask on a first opening of a de-podder, such that the lid of the box prevents gas flow through the first opening, (d) purging the interior of the de-podder with clean gas, (e) opening the box by separating the mask-carrying portion from the lid, keeping the lid in place, (f) extracting the mask from the de-podder through a second de-podder opening into a mini-environment chamber, using a mini-environment manipulator and placing the mask inside a loadlock through a first loadlock opening, (g) pumping down the loadlock, (h) extracting the mask from the loadlock through a second loadlock opening and moving the mask to the interior of a vacuum chamber, using a vacuum manipulator, (I) placing the mask on a mask mount, and (j) processing the mask.

Embodiments of the present invention provide a machine for processing masks transported to and from the machine inside boxes, including: a filtered air environment portion, at least one atmospheric manipulator, at least one de-podder, a gas mini-environment portion, purged with clean gas at substantially atmospheric pressure, at least one mini-environment manipulator, at least one loadlock, a vacuum portion, and at least one vacuum manipulator.

Embodiments of the present invention provide a system including a reticle and a cover coupled to the reticle to protect the reticle. The cover includes a frame and a movable panel that moves to allow direct access of light to the reticle during an exposure process. The reticle and cover are moved to a stage using a robot gripper. The reticle and cover may be coupled to a baseplate before being moved.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
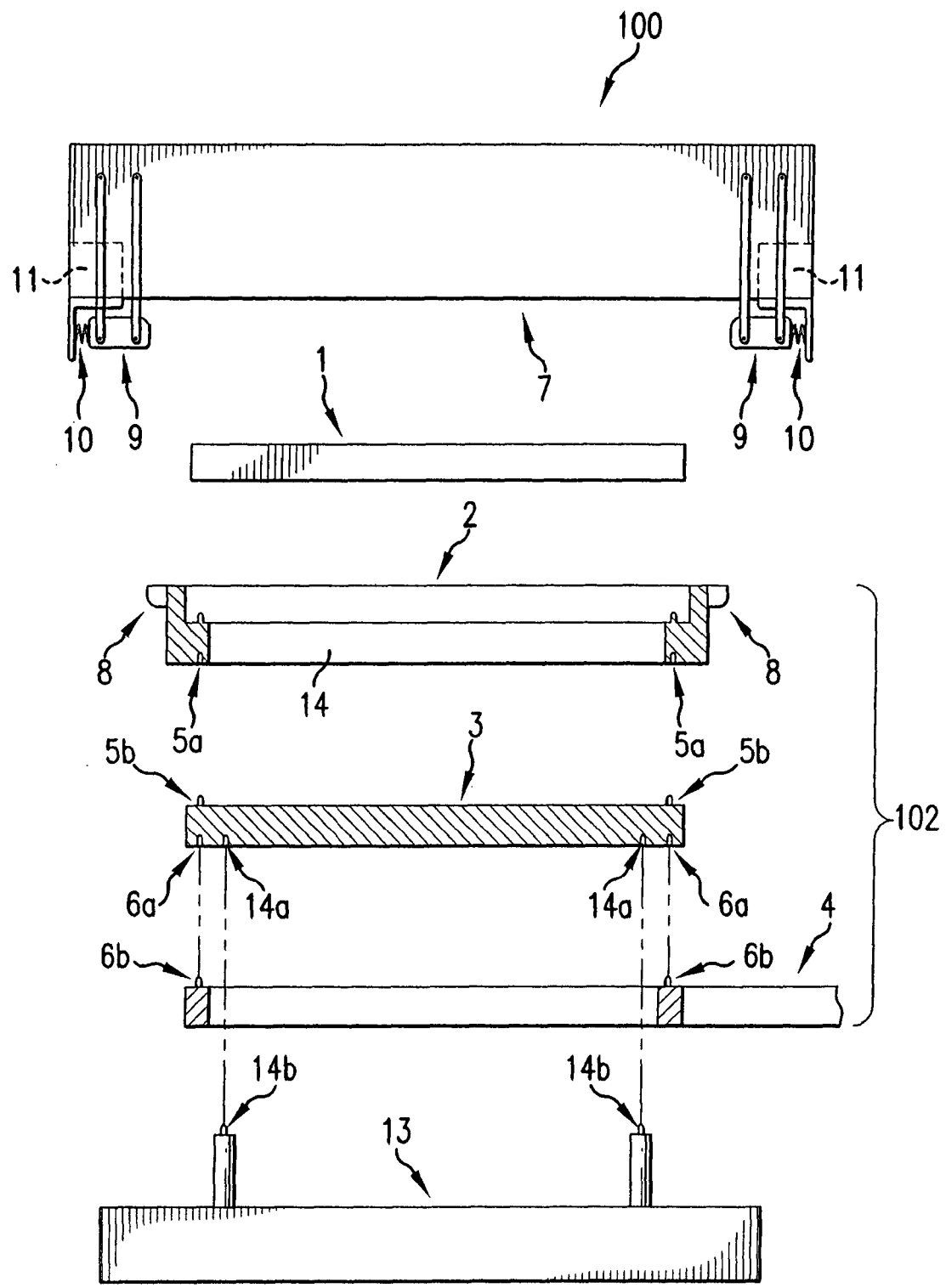
FIG. 1 is an exploded diagram of the two-part cover in position on a reticle according to an embodiment of the present invention.

The present invention will now be described with reference to the accompanying drawings. In the drawings, some like reference numbers indicate identical or functionally similar elements. Additionally, the left-most digit(s) of most reference numbers identify the drawing in which the reference numbers first appear.

DETAILED DESCRIPTION

Overview

Embodiments of the present invention provide a cover for protecting the reticle that is improved with respect conventional systems. Other embodiments of the present invention provide a pod or reticle transport box, compatible with the cover, which further protects the reticle against particles. Still other embodiments of the present invention provide a loadlock, compatible with the cover, which further protects the reticle against particles when transitioning the reticle between atmospheric pressure and vacuum. Still further embodiments of the present invention provide a reticle handler having three separate environments (e.g., filtered room air, gas purged mini-environment, and vacuum) with each environment being best suited for cost-effectively reducing the contamination of the reticle for its respective handling steps. Even further embodiments of the present invention provide a method for handling the reticle with all of the above that minimizes reticle contamination.

Lithography has traditionally relied on a pellicle to protect the patterned area of the reticle from particulate contamination. However, as discussed above, the absence of pellicle materials that are transparent to Extreme Ultra Violet (EUV) light precludes this approach. In addition, the limitations of internal alignment make removal of the entire reticle cover difficult to correct. Therefore, according to embodiments of the present invention, a reticle is protected by a reticle cover that includes a frame for supporting the reticle and a panel that can be removed during exposure and cleaning.

While lithography systems operate in clean environments, particles are generated during processing. These particles may contaminate the reticle. The reticle is periodically cleaned such that the particulate level on the reticle remains below an allowable threshold. It is thus necessary to consider the sources of particle generation within a lithographic system. Typically, particles within an otherwise clean system are generated as a result of friction. In conventional systems, particles are generated when reticles are transferred from one place to another. Since in conventional systems it is possible for the reticle to slide during transport, additional particles may be generated as a result of any reticle sliding during transport. Finally, vibration in conventional systems also causes friction and associated particle generation.

According to embodiments of the present invention, positional locators and ridges on the removable cover are included to eliminate transfer and reticle sliding friction. However, cover attachment and removal can produce friction. Likewise, vibration, as in conventional systems, also contributes to particle formation. Thus, these differences in the causes of particle generation have been considered when implementing the embodiments of the present invention.

In addition to particle generation, particle settling is also a consideration when designing a lithographic system. The use of a removable panel in the embodiments of the present invention eliminates the opportunities for particles to settle onto the reticle at all times, except during the exposure step. Significant particle settling occurs at times other than during exposure, thus the use of a removable panel according to embodiments of the present invention provides significant protection to the reticle from particle settling even though the cover is removed during exposure steps.

Finally, particle migration must also be considered. Particle migration occurs during turbulence caused by fast motions and quick pressure changes. In the EUV systems, many of the movements occur in a high vacuum environment. Thus, turbulence during movements from, for example, a library shelf to a projection mount is minimal. However, pressure changes are involved, so this source of turbulence must be considered. Therefore, according to embodiments of the present invention, this additional source of particle migration is substantially eliminated through the use of a removable panel coupled to a frame that is set to the reticle.

Two Part Cover and Pseudo-Kinematic Registration of Same

FIG. 1 illustrates an exploded view of system 100 including a two-part cover 102 according to an embodiment of the present invention. Two-part cover 102 includes a frame 2, which supports a reticle 1 during handling and remains in contact with reticle 1 and a stage 7 during exposure. Frame 2 includes an opening 14 that can be larger than a field of reticle 1 to allow actinic light to pass through opening 14 during an exposure process. Frame 2 also includes an attachment device 8, which corresponds to attachment device 9 coupled to stage 7. Thus, attachment device 8 allows frame 2 to be held by attachment device 9 on stage 7.

This embodiment also includes a panel 3, which is separated from frame 2 just prior to lithographic exposure and re-attached to frame 2 just after lithographic exposure. Panel 3 can be made from a material that is transparent to visible light to allow visual inspection and identification of a front side of reticle 1.

Attachment devices 8 and 9 are shown between stage 7 and frame 2, as well as between frame 2 and panel 3. Feature pair 5a and 5b can be included, as illustrated, between stage 7 and frame 2. Feature pairs 5a and 5b can be "between pieces," which, as one skilled in the relevant art(s) would recognized based on at least the teachings described herein, can be selected from a group including magnets and magnetic targets respectively in each piece, mechanical fasteners, such as spring-loaded latches or bi-stable latches in one piece and matching tabs in the other piece, and gravity dependent devices, such as resting features located in one piece on mating features located in the other piece.

According to embodiments of the present invention, attachment devices 8 and/or 9 can have the following design criteria including, but not limited to: a) attachment devices 8 and/or 9 can be detachable by devices external to two-part cover 102, which can be located in a robot gripper 4 that loads reticle 1 onto stage 7, or in stage 7 itself, and/or; b) the release and re-attachment of attachment devices 8 and/or 9 should produce minimal contamination particles in order to avoid contaminating reticle 1 (for this purpose, non-contacting devices can be used to actuate attachment devices 8 and/or 9 are preferred), and/or; c) attachment devices 8 and/or 9 should be self-sustaining, so that no applied external action is needed to keep the pieces together once they have been initially attached.

In an embodiment, robot gripper 4 can be adapted to squeeze two or more spring-loaded latches in order to release the pieces.

In another embodiment, electromagnets in stage 7 can be adapted to interact with permanent magnets in the latches in order to cause them to release.

In a further embodiment, electromagnets in robot gripper 4 could release panel 3 by overpowering the magnetic attraction between permanent magnets and targets respectively in both pieces of cover 102. Likewise, electromagnets in stage 7 could be temporarily energized to overcome the magnetic attraction between permanent magnets and magnetic targets respectively located in frame 102 and stage 7.

Many other embodiments are also possible, including but not limited to permutations and combinations of attachment features and placement of the release devices in the gripper instead of the stage or vice versa. All these permutations and combinations are contemplated within the scope of the present invention.

With continuing reference to FIG. 1, a variation of the above-described embodiment can use gravity to keep reticle 1, frame 2, and panel 3 together. Specifically, robot gripper 4 can support panel 3, frame 2 can rests on panel 3, and reticle 1 rests within frame 2. Corresponding feature pairs 5a and 5b can align frame 2 to panel 3 and corresponding feature pairs 6a and 6b can align panel 3 to robot gripper 4.

In various embodiments, feature pairs 5a and 5b and 6a and 6b can be chosen from a group including kinematic mounts (for example, with balls in grooves or conical seats), dowel pins in holes and slots, and nesting one piece within the other. A device for energizing to holding and releasing frame 2 from stage 7 can be located in stage 7, as shown in FIG. 1, or built into the robot gripper 4 instead.

According to another exemplary embodiment, two or more spring-loaded mechanical latches 9 located in stage 7 can be used to hold frame 2, through use of tabs 8, to stage 7, as shown and described below with respect to FIGS. 2 and 3.

In further embodiments, the release of the latches can be achieved, for example, by momentarily applying a magnetic force via solenoids 11, coupled to stage 7, to overcome a closing force applied by springs 10, thus retracting the latches, which can be made of a magnetic material.

Feature pairs 14a and 14b can be placed on a bottom side of panel 3 and on other surfaces where system 100 (e.g., a reticle/cover assembly) has to be placed. For example, on vacuum library shelves and on standard mechanical interface (SMIF) pod baseplates, generically represented as item 13, and described in more detail below.

Figure 2:
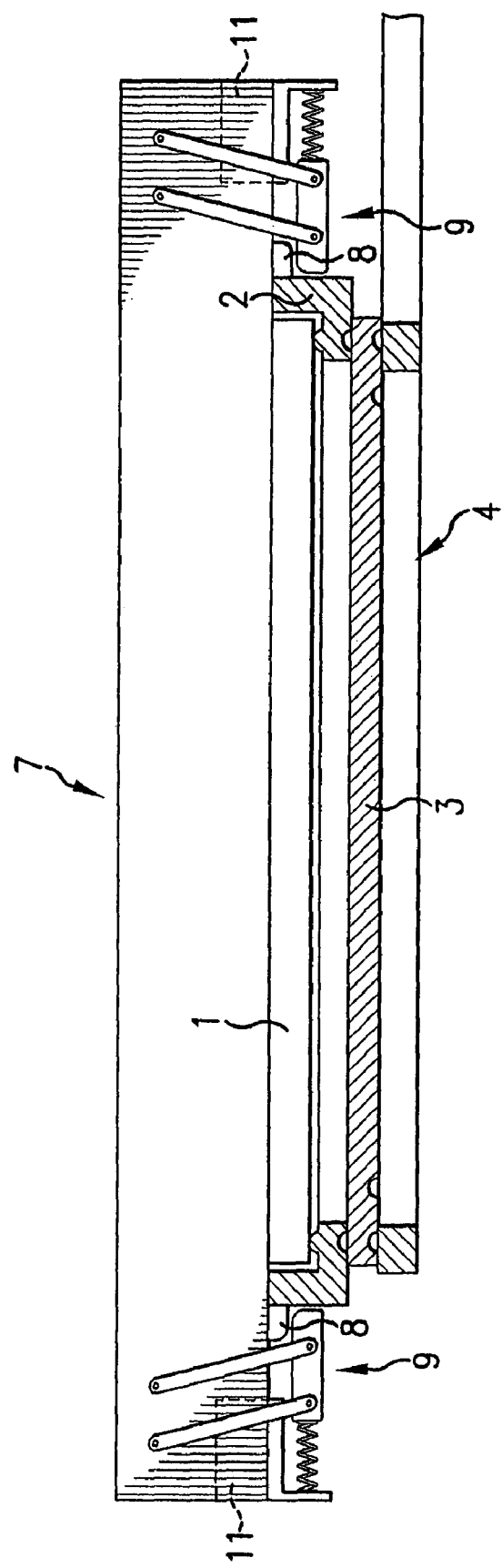
FIG. 2 is a diagram showing the reticle in the two-part cover being loaded onto the stage by a robot according to an embodiment of the present invention.

FIG. 2 shows a state of reticle 1 and cover 102 according to an embodiment of the present invention. Thus, the state shown in FIG. 2 shows frame 2 and panel 3 being loaded onto stage 7 using robot gripper 4. In one embodiment, the state is when solenoids 11 have been de-energized and latches 9 have captured tabs 8. During this state frame 2 in secured in place. This state can be prior to retracting robot gripper 4.

Figure 3:
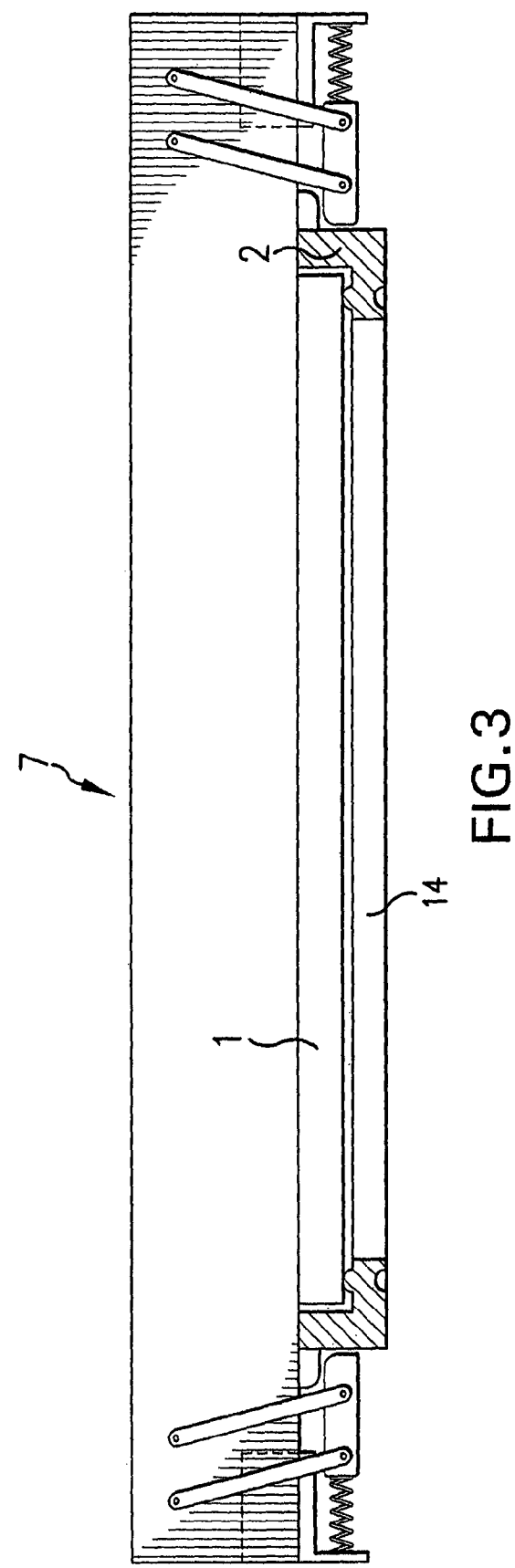
FIG. 3 is a diagram showing the reticle being exposed for lithography according to an embodiment of the present invention.

FIG. 3 shows a state of system 100 according to embodiments of the present invention. During the state, reticle 1 and frame 2 are supported solely by the stage 7 after robot gripper 4 (not shown in FIG. 3) has retracted, carrying away panel 3 (not shown in FIG. 3). In some embodiments, lithographic exposure can begin at this point through opening 14.

An embodiment where robot gripper 4 holds frame 2 instead of panel 3 can be simpler, and therefore preferable to other embodiments. This is because gravity is exploited to keep panel 3 and frame 2 together. The downward motion of robot gripper 4 is substantially all that is needed to detach 3 panel from frame 2 after frame 2 has been captured by stage 7.

Alternative embodiments that also facilitate alignment of reticle 1 to stage 7, and an explanation of a method used for alignment, are described below.

As described elsewhere herein, reticle 1 should be placed and oriented consistently with a wafer. This substantially ensures that a layer of circuitry being currently copied from a reticle pattern onto the wafer will line up with pre-existing layers on the wafer.

In several embodiments, described in more detail below, reticle 1 can be transported to the lithography system (or "litho tool") in a container (e.g., a pod), a portion of which can be item 13. The pod can include a frame that supports reticle 1 and a panel that keeps contaminant particles away from reticle 1 during transport. In these embodiments, a bottom side of the pod frame can have locating features that correspond to matching locating features in the litho tool, such that the orientation of the SMIF pod relative to the litho tool is uniquely determined.

With reference again to FIG. 1, reticle 1 can be held securely in place on a top side of frame 2 by a combination of resting points and stops built into frame 2 and springs built into panel 3. Since reticle 1 can be a flat square with no special locating features, there may be eight ways that it will fit within the nest formed by the resting points, stops and springs.

When loading reticle 1 into the pod, care should be taken to place reticle 1 with the patterned side facing in a desired direction (e.g., right side up) and with a desired orientation (e.g., 90 degrees) relative to the pod. For example, a top edge of the pattern may be towards a front side of the pod. Then, the location and orientation of reticle 1 relative to the litho tool can be known when the reticle pod is placed in the litho tool. Typically the position (X,Y) uncertainty is in the order of about 1 mm (millimeter) and the angular orientation ($\theta z$) uncertainty is in the order of about 1 degree. However, this accuracy is not sufficient for current lithography. The position uncertainty must be reduced to only several micrometers and the orientation uncertainty to less than 1 arc-second.

Thus, according to embodiments of the present invention a lithography tool can be equipped with a pre-aligner. The pre-aligner precisely positions and aligns the pattern in reticle 1 to the lithography tool by looking at targets on the reticle pattern and moving reticle 1 as needed to correct its position and orientation. Robot 4, or any other dedicated transfer mechanism, typically transfers reticle 1 from frame 2, to the pre-aligner and from the pre-aligner to stage 7. The transfer from the pre-aligner to stage 7 must be very accurate, since any positioning errors introduced by the transferring devices will reduce the placement accuracy of reticle 1 on stage 7. Hence, a very accurate and repeatable robot or transfer mechanism should be used for the critical step of transferring reticle 1 from the pre-aligner to stage 7.

Precision-movement robots can be located at a printing stage of the lithography system, which is adequate for deep ultra violet (DUV) lithography. However, this may not work for to EUV lithography because the EUV process must take place in vacuum. This is due to the total absorption of EUV light at normal pressures, as discussed above. Thus, a vacuum-compatible robot must be used. Since motors and electronics generate heat and outgas contaminants, which in a vacuum are very difficult to remove, vacuum compatible robots are designed to have their motors and electronics outside the vacuum chamber. Inside the chamber, long mechanical linkages are used to transfer the motion to the object being handled. This arrangement is clean and produces no heat inside the chamber but it suffers from inherently poor positioning accuracy and repeatability due to the considerable length, low stiffness and "play" of the linkages. Hence, the available vacuum robots are inadequate for performing the critical step of transferring the reticle from the pre-aligner to the stage. It is clear that an alternative solution that would make the accuracy and repeatability of the robot non-critical would be desirable.

Figure 4:
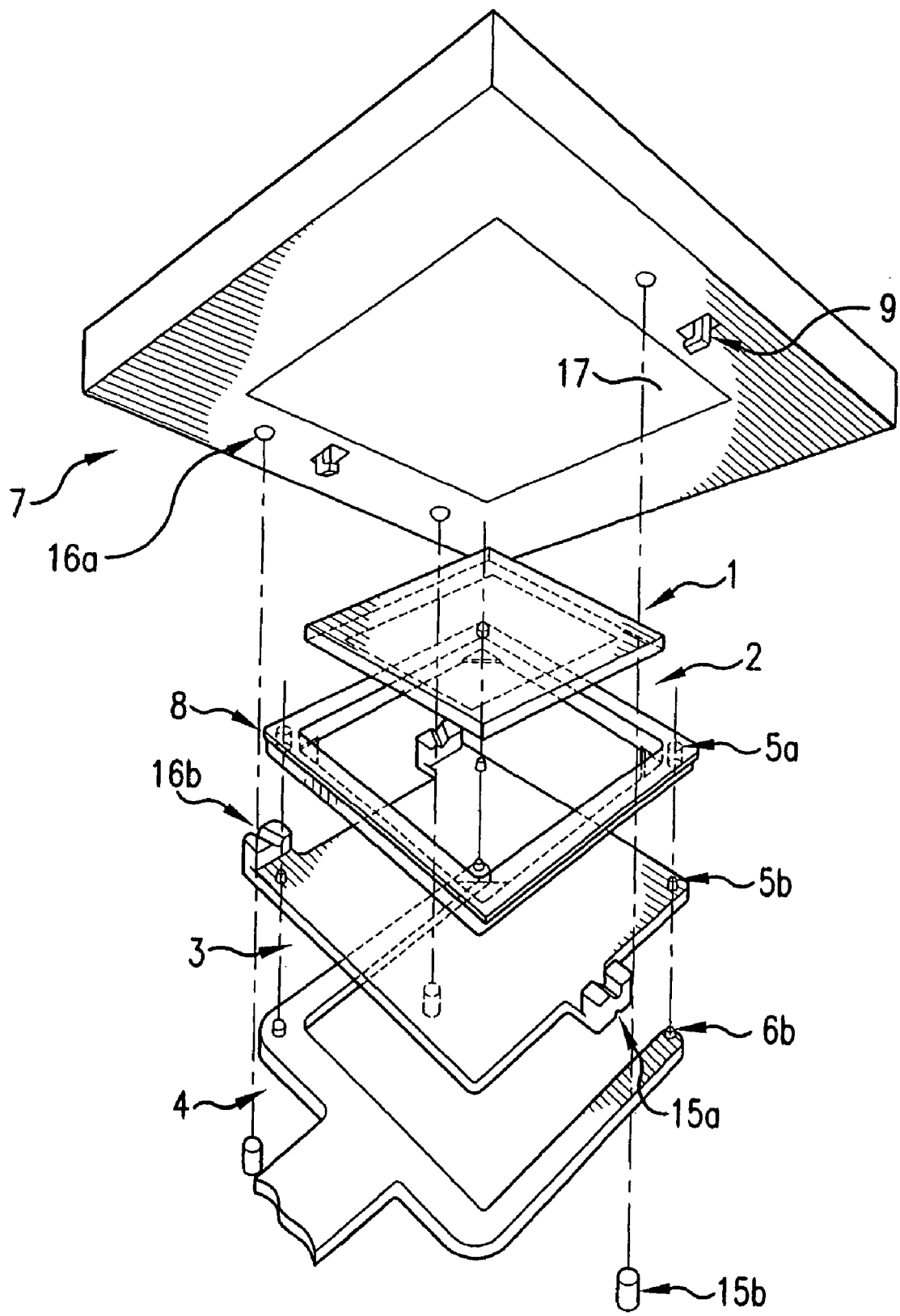
FIG. 4 is an extrapolated diagram illustrating in relief the two-part cover according to an embodiment of the present invention.

FIG. 4 shows an embodiment of system 100 in which panel 3 can be used for accurate and repeatable positioning in the final transfer, hence allowing the use of cleaner and necessarily imprecise robots. A precise location of panel 3 relative to the pre-aligner can be achieved by kinematically docking panel 3 to the pre-aligner. Lower V-grooves 15a engage with round-tip pins 15b, which in one embodiment are located in the pre-aligner. Lower half balls 6a (see FIG. 1) can be similar to tip pins 15b and upper V-grooves 16b can be similar to V-groove 15a. The use of V-grooves 15a and 16b and round-tip pins 15b and 16a to dock objects kinematically is well known, and there also exist other well-known designs of kinematic docks that are equally effective. The present invention is not limited by the use of V-grooves and round-tip pins, but can be implemented in principle with all known designs of kinematic docks.

Robot gripper 4 can then picks the panel/frame/reticle assembly and move it just below stage 7. Similarly, precise kinematic location of panel 3 relative to stage 7 can be achieved by engaging upper V-grooves 16b in panel 3 with half balls 16a in stage 7 when robot gripper 4 moves the panel/frame/reticle assembly upwards. After panel 3 has kinematically engaged stage 7, latches 9 and an electrostatic chuck 17 can be energized, respectively clamping frame 2 by tabs 8 and pulling reticle 1 against stage 7. Robot gripper 4 can then move panel 3 downwards, and withdraw with it, away from stage 7.

A property intrinsic to kinematic docks is that they can be repeatable within a few microns, only requiring that the initial alignment be within the capture range of the mating features. For example, the alignment of each half ball 16a to each upper V-groove 16b must be such that each ball 16a will initially contact any portion of the corresponding groove 16b. If this condition is met, then regardless of initial misalignment, the same final relative position will be reached. The capture range can depend on the size of the mating features. For example, using the feature sizes shown in FIGS. 1-4 a capture range of plus or minus about 1 mm is easily achievable. Since this range is larger than the typical repeatability error of vacuum robots, the intended functional de-coupling can be achieved. It is necessary when kinematically engaging panel 3 to stage 7 that robot gripper 4 be compliant in the (X,Y) plane, so as not to force a motion trajectory established by robot gripper 4 upon the kinematic dock, but to let the interaction of the docking features define the final trajectory. The considerable length, low stiffness, and play in the robot linkage can provide the small amount of compliance needed.

As discussed thus far, the embodiments of the present invention solve the problem of accurately transferring frame 2 from the pre-aligner to stage 7 using a robot with accuracy and repeatability. For the transfer to be useful, in addition, reticle 1 must remain in exactly the same position relative to panel 3 from the moment it is picked up from the pre-aligner to the moment chuck 17 is energized. One way to insure this would be to have the reticle 1 fit tightly within frame 2 and frame locating features 5a have very tight clearances with their corresponding locating features 5b. However, this may not be the most desirable scenario because tightly fitting parts tend to produce many particles when pulled apart. Fortunately, in most of the embodiments of the present invention tight fits may not be needed because friction between the parts is sufficient to keep them in place relative to each other.

Due to the difficulties associated with motors inside a vacuum, and because suction gripping does not work in vacuum, vacuum-compatible robots can be designed to accelerate and decelerate just slowly enough to enable the use of simple passive grippers that hold wafers on three pins purely by gravity and friction. Vacuum robot manufacturers provide substantially no sliding using simple grippers.

Thus far, we have addressed the final transfer accuracy problem. Other embodiments of the present invention show how cover 2 can also facilitate the task of aligning of reticle 1 to stage 7. In general, as stated above, a reticle coming into the tool in a pod can have a positioning error of about 1 mm and an orientation error of about 1 degree relative to the panel. These errors can be reduced to a few microns and less than about one arc-second. To do this, it is sufficient for the pre-aligner to measure and correct the relative alignment and positioning of reticle 1 to panel 3, since kinematic docking of the panel to the stage has been shown above to be very accurate. Preferably the re-positioning should be done without removing reticle 1 from frame 2, so that no particles are generated on any reticle surface.

In various embodiments, a method for aligning reticle 1 to panel 3 is simplified by two-part cover 102. The robot brings the panel/frame/reticle assembly to the pre-aligner, which is equipped with a set of round-tip pins 15b. The assembly is thus docked kinematically to the pre-aligner by engaging lower V-grooves 15a to round-tip pins 15b. Hence, panel 3 is precisely aligned and positioned relative to the pre-aligner. Therefore all that is necessary to precisely position and align reticle 1 to panel 3 is to precisely position it and align it relative to the pre-aligner. To do this, first the errors should be measured and then corrected.

According to one embodiment of the present invention, one way to measure the errors is to equip the pre-aligner with a camera-based vision system, which can measure the angular and positional error between targets in the reticle pattern and targets permanently affixed to the pre-aligner and calibrated to the round-tip pins. Since the pattern is on the bottom side of reticle 1, the camera has to look through panel 3, which should be transparent at the wavelength that the camera operates. There are other well-known ways to measure the positional and angular errors, and the present invention is not limited to using a camera and a set of targets.

In an embodiment, in order to correct the position and angular orientation of reticle 1 relative to the pre-aligner, the pre-aligner can be equipped with a precision manipulator having X, Y, Z and θz degrees of freedom. The pre-aligner also can have a gripper capable of lifting frame 2 by engaging tabs 8 from below. The precision manipulator would first lift the frame/reticle just off panel 3, then effect the X, Y, and θz corrections and then lower the frame/reticle back onto panel 3. At this point, reticle 1 is aligned relative to panel 3 and ready for transfer to stage 7. Being able to re-position frame 2 relative to panel 3 requires that there be ample clearance between positioning features 5a and 5b.

It is to be appreciated that, since the vacuum robot is known to be able to transfer objects without slippage, the various features pairs can increase the accuracy for precise location. Additionally, the various feature pairs can be a safety feature to prevent gross accidental sliding in case of abrupt robot stopping, which can be caused by collision or power failure. In that event, precise alignment would be lost, but the various features pairs would prevent reticle 1 from falling off robot gripper 4.

Finally, in embodiments used in a scanning lithography system with one long range degree of freedom (for example it scans along the Y axis), it may not be necessary for the pre-aligner to correct the position error along the degree of freedom coinciding with the scan axis of stage 7. It may only be necessary to measure the position error and communicate it to a stage controller, which can then compensate for the position error by correspondingly offsetting the stage Y position during scanning.

Thus, in various embodiments, the various feature pairs can result in a precision manipulator in the pre-aligner that has only one horizontal translational degree of freedom, X in the case of the example, as well as Z and θz, which are still required. Thus, the design of the precision manipulator in the pre-aligner can be simplified for scanning lithography tools.

Figure 5:
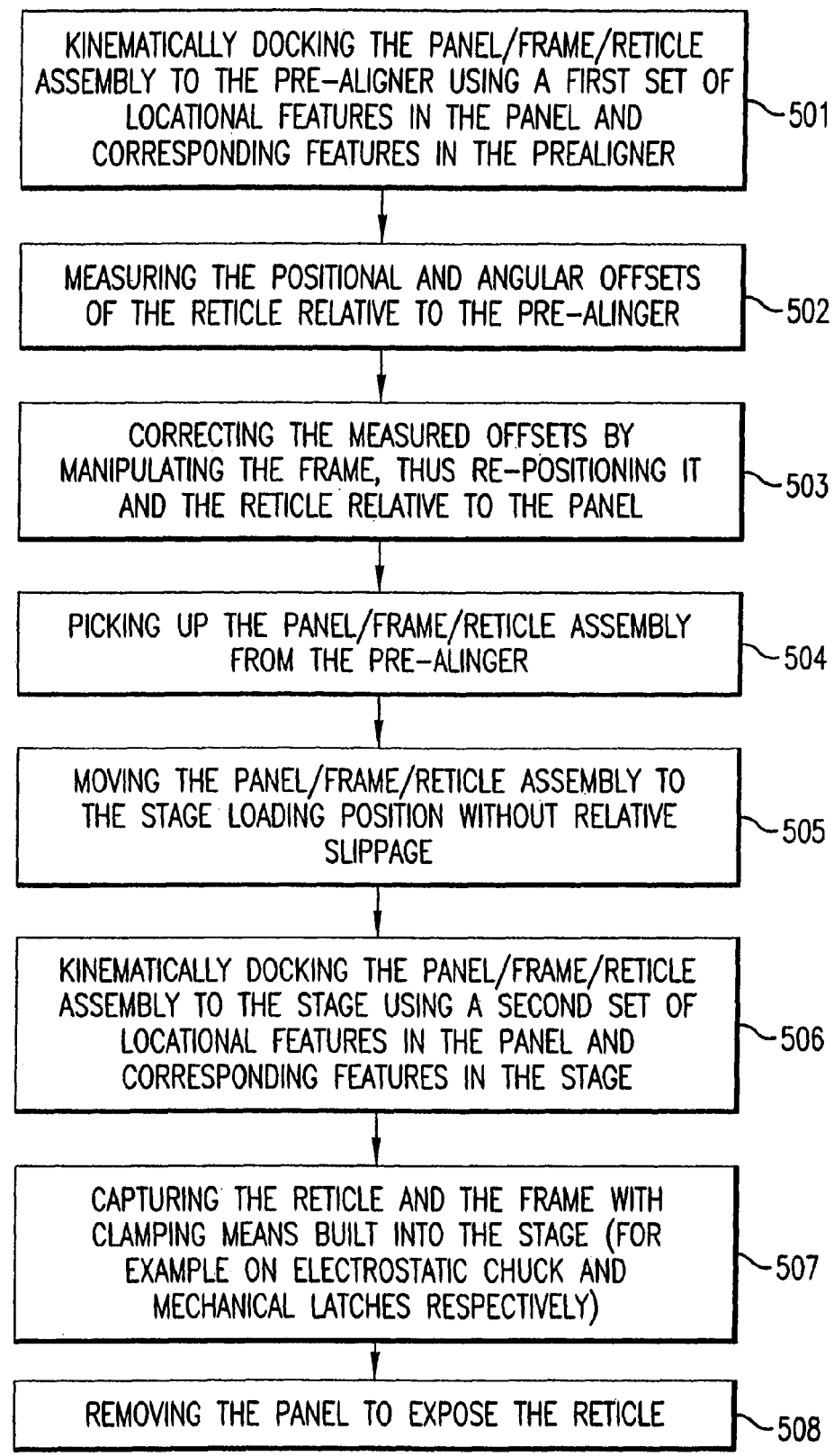
FIG. 5 is a method of alignment and transfer using the two-part cover according to an embodiment of the present invention.

FIG. 5 shows a flow chart depicting a method 500 according to an embodiment of the present invention. Method 500 can be a method of alignment and transfer using a two-part cover. In step 501, a panel/frame/reticle assembly can be kinematically docked to a pre-aligner using a first set of feature pairs in the panel and corresponding feature pairs in the pre-aligner. In step 502, the positional and angular offsets of the reticle relative to the pre-aligner are measured. In step 503, the frame is manipulated to correct for the measured offsets, which re-positions the reticle relative to the panel. In step 504, the panel/frame/reticle assembly is picked up from the pre-aligner. In step 505, the panel/frame/reticle assembly is moved to the stage loading position with substantially little relative slippage. In step 506, the panel/frame/reticle assembly is kinematically docked to a stage using a second set of feature pairs in the panel and corresponding features in the stage. In step 507, the reticle and the frame are secured with clamping devices built into the stage (e.g., an electrostatic chuck and mechanical latches, respectively). In step 508, a panel us removed to expose the reticle.

As previously discussed, the embodiments of the present invention is useful for substantially reducing particulate contamination generation when handling and aligning a reticle in an EUV tool. In convention systems that did not use a cover, reticle contact is made/broken each time the reticle is removed-from/replaced-in the SMIF pod, each time it is placed-in/removed-from the in-vacuum library, and each time it is loaded/unloaded at the stage.

According to embodiments of the present invention as discussed above and below, an improvement over conventional systems can be realized by using a two-part cover. Contact between a reticle and a frame is never broken because the frame remains in contact with the reticle even during exposure. It has been assumed that the number of particles generated on the reticle surface while handling the reticle varies directly with the number of times that mechanical contact with the reticle surface is made/broken. By completely eliminating the need to make/break contact with the reticle within the lithography tool, the two-part cover is a significant improvement over a one-piece cover as taught in conventional systems, which merely reduces the number of particle-generating events directly involving the surface of the reticle, compared with direct handling of the reticle by the gripper.

The two-part cover according to embodiments of the present invention also allows the use of a soft material for contacting the reticle without much regard to durability of the soft material, since repeated abrasive action is, in principle, eliminated. Using a well-chosen soft material presumably reduces surface damage and particle generation during the initial placement of the reticle in the frame. A soft material such as a soft polymer, for example, may tend to flow, so as to conform to instead of scratching the delicate polished surface of the reticle.

In contrast, in conventional systems that do not use a two-part cover and that directly handling of the reticle with a robot gripper require a hard material in the gripper's contact points for acceptable durability of the gripper. The best hardness of the contact points of a one-part cover falls somewhere in between, since some contacting events still take place, but not as many. However, through the use the two-part cover according to embodiments of the present invention allows the two-part cover to be replaced when deformation leads to unacceptable precision.

The two-part cover according to embodiments of the present invention also facilitates pre-alignment of the reticle to the stage. This allows for precise final transfer from the pre-aligner to the stage even with a low-precision robot.

The two-part cover of the present invention also can be easier to keep clean than the robot gripper is. Whereas invasive maintenance is required to clean the robot gripper, which is located deep within the lithography tool and in vacuum, there is an opportunity to clean or replace the cover much more conveniently each time the reticle is ejected from the litho tool.

The present invention is described in terms of this example lithography environment using a SMIF pod. Description in these terms is provided for convenience only. It is not intended that the invention be limited to application in these example environments. In fact, after reading the following description, it will become apparent to a person skilled in the relevant art how to implement the invention in alternative environments known now or developed in the future.

Therefore, according to embodiments of the present invention a system and method are used to pseudo-kinematically register a reticle to a protective cover. This can be done to maintain precise relative position of the reticle during pre-alignment measurement and transfer to a reticle stage. This can eliminate the need for mechanically re-positioning the reticle during pre-alignment of the reticle in the lithography tool. Secondly, it discloses a method of hardening the reticle contact areas so that they generate fewer particles when the reticle comes into contact with the cover.

Figure 6A:
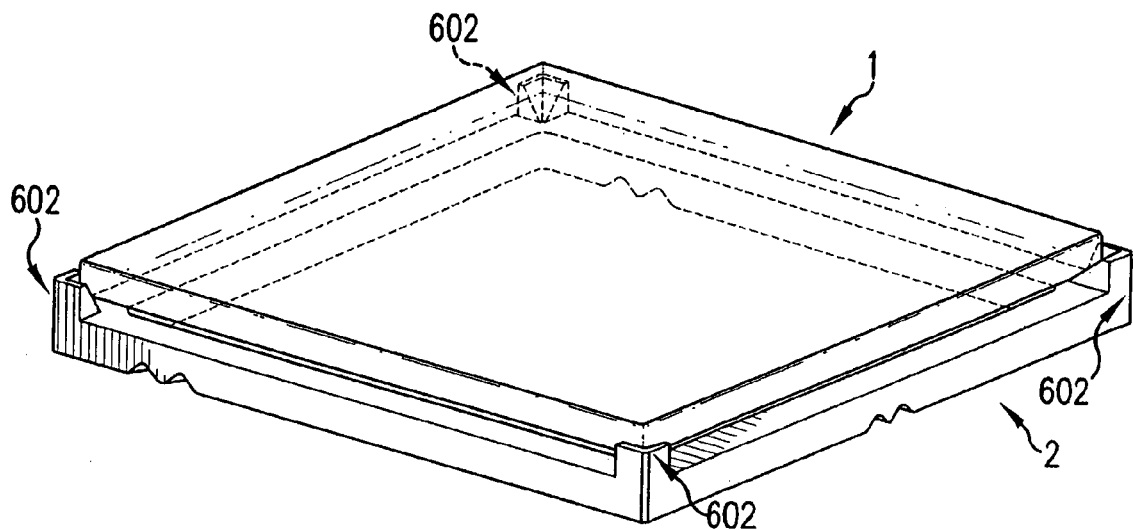
FIGS. 6A and 6B are diagrams showing the registration features according to an embodiment of the present invention.
Figure 6B:
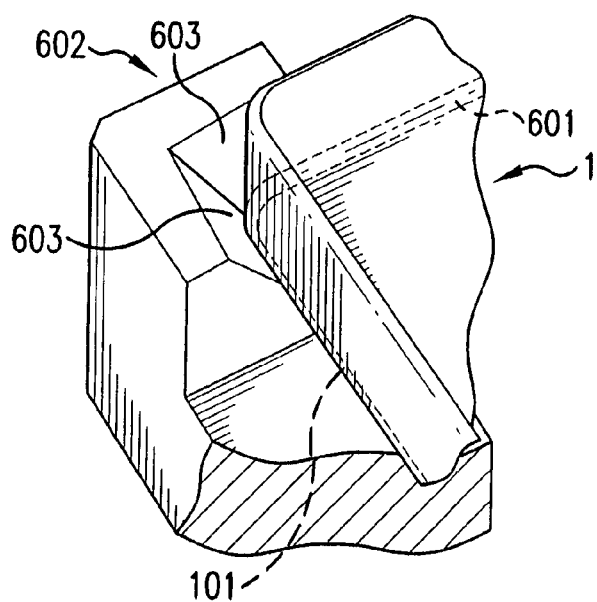

FIGS. 6A and 6B show a two-part cover 102 according to embodiments of the present invention. Reticle 1 has edges 601 that can allow precise registration against registration features 602 against surface or wall 603 in frame 2. In one embodiment, chamfering is performed on at least a portion of edges 601 of reticle 1 that contact the kinematic registration features 602. In another embodiment, the portion of the edges 601 of reticle 1 are formed with a radius instead of a chamfer. In yet another embodiment, an intersection of modified edge portions at corners of reticle 1 produce a spherical or toroidal sector (an eighth of a sphere or of a toroid) in each corner, which then interfaces against a compatible registration feature 602 in each corner of frame 2. A user can choose which portions of the modified reticle edge 601 will be contacted and which portions will be avoided.

With regard to registration features 602 in frame 2, placement is not limited to the corners of the frame as shown in FIGS. 6A and 6B. However, in a preferred embodiment this may be an advantageous location. For example, frame 2 could have registration features 602 in the middle of each side. It will also be apparent that the actual shape of registration feature 602 may be varied to best accommodate reticle edge 601. For example, in one embodiment registration features 602 can be V shaped grooves, with each surface 603 of groove 602 being flat. This particular shape is suited for accommodating a radius at reticle edges 601. It is to be appreciated that in other embodiments if reticle edges 601 are chamfered they can be best accommodated by convex (instead of flat) groove surfaces in registration features 602.

According to one embodiment of the present invention, use of registration features 602 can obviate step 503 in FIG. 5. This is very advantageous, because a substantially complex pre-aligner mechanism would be required in order to manipulate frame 2. By eliminating the need to re-position frame 2 relative to panel 3, the design of the lithography tool is simplified.

Figure 7:
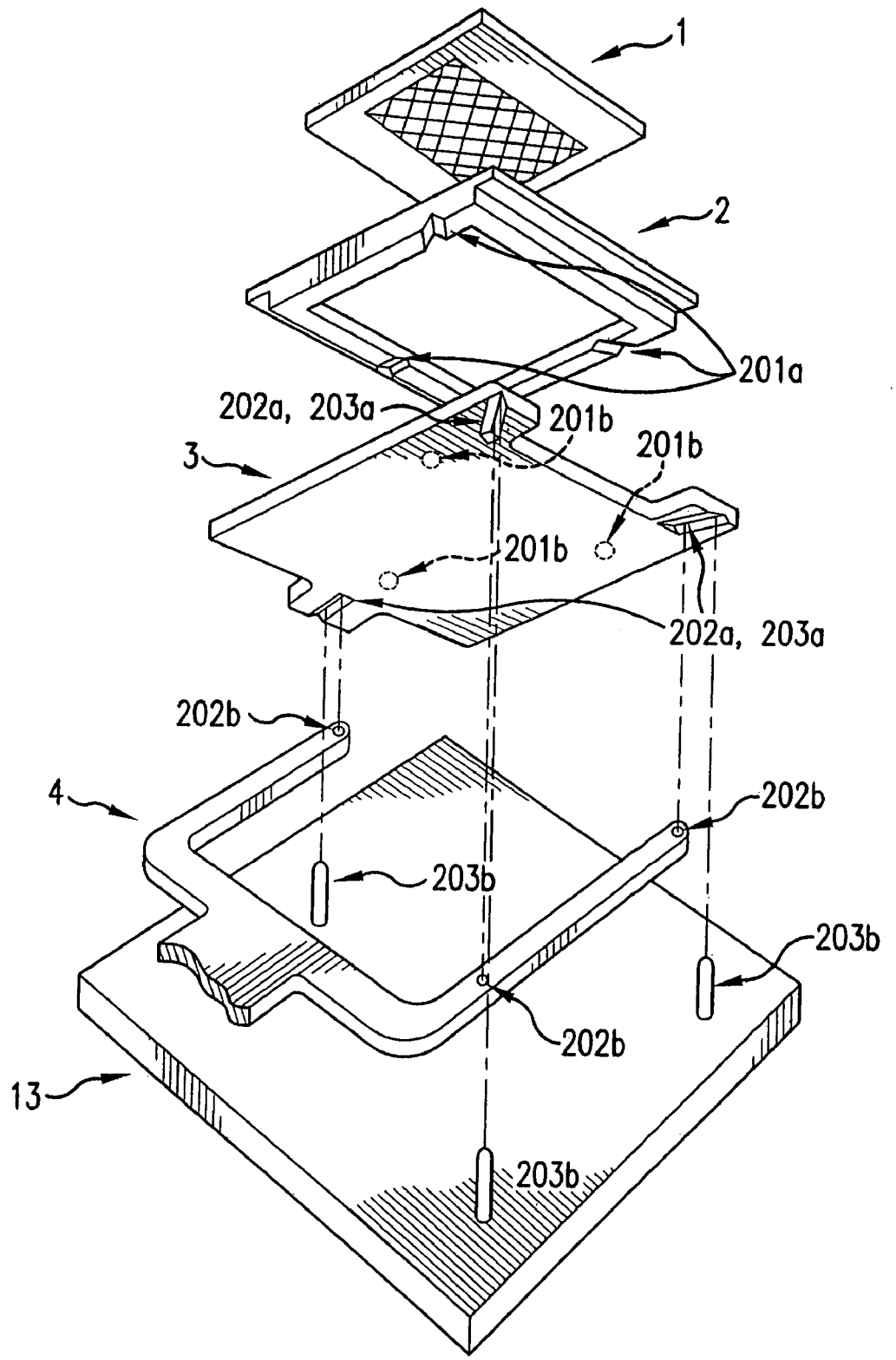
FIG. 7 is an extrapolated diagram illustrating in relief the two-part cover with registration features according to an embodiment of the present invention.

FIG. 7 shows system 100 according to an embodiment of the present invention. Frame 2 can hold reticle 1 and can be kinematically registered to panel 3 via a first set of kinematic registration feature pairs 201a and 201b. Similarly, panel 3 can be kinematically registered to robot gripper 4 via a second set of kinematic registration feature pairs 202a and 202b. In addition, a third set of kinematic feature pairs 203a and 203b can be used to kinematically register panel 3 to vacuum library shelves and SMIF pod baseplates generically represented by item 13.

In the embodiment shown in FIG. 7, kinematic features 202a and 203b 703b share the same groove, with 202a interfacing to 202b within the innermost portion of the groove, and 203a interfacing to 203b within the outermost portion of the groove. It will be apparent to one skilled in the art that this relative placement could be reversed. It will also be apparent that separate grooves could be used to implement each of these kinematic features.

In another embodiment, a one-piece cover can be used. In this embodiment, frame 2 can be secured to (e.g., glued or made from the same block of material as) panel 3 in order to create a one-piece cover. The one-piece cover is entirely removed for lithographic exposure of reticle 1. Therefore, feature pairs 201a and 201b may not be needed in this one-piece cover embodiment.

Hardened Reticle

It is generally known that the EUV-reflective coating of reticle 1 can be intrinsically delicate and soft. Thus, the coating can be prone to generating particles whenever contacted. It would therefore be desirable to have designated areas devoid of EUV-reflective coating, which could be used for the purpose of supporting or handling reticle 1 by its reflective side. To do this, a harder substrate material would therefore be brought to the surface uncovered, henceforth "exposed." Unfortunately, it appears to be practically very difficult to produce areas exposing the bare reticle substrate, henceforth "bare spots." One known method for producing bare spots is to use a mask that covers them during the ion-beam sputtering process that is used to deposit the EUV-reflective coating. The problem with this approach is that due to the nature of the deposition process, loose particles or flakes tend to form on the mask and break off when the mask is removed at the end of the process, with some particles or flakes landing on and contaminating the reticle. Another known method for exposing areas of the substrate is to selectively etch the EUV-reflective coating from the areas designated for handling. The problem with this approach is that the etching process also tends to damage the remaining areas of the reticle.

It might also appear that the problem of supporting the reticle could be solved solely by using the radiused or chamfered edges as described elsewhere in this disclosure. However, this is not true, since the fragility of the EUV-reflective coating dictates that the blank substrate must already have the edges machined to final shape before coating, and due to the uniform, non-selective coverage produced by the sputtering process that deposits the coating, the unmasked chamfered or radiused edges would also become coated with fragile material.

To solve the above-described problems, coating the EUV-reflective material with a harder material has been proposed. The natural choice for this material is the EUV-blocking layer that is deposited on top of the EUV-reflective layer and selectively etched, in order to create, or "write" the reticle pattern. Unfortunately, to have the correct optical properties, this layer must be very thin. A thin blocking layer on top of the soft reflective material is likely to break under the high horizontal stress of mechanical handling contact. Adding and selectively etching a thick layer on top of the blocking layer is possible but costly and unproven.

Therefore, what is needed is a process that can remediate the intrinsic softness and fragility of the reflective coating, without requiring masking or removing of coating in order to create bare spots. What is also needed is a method requiring neither bare spots in the selected contact areas nor covering the areas with an additional protective layer.

It is suspected that the intrinsic softness of the EUV-reflective layer is due to its multi-layered nature. As is known in the art, the EUV-reflective layer henceforth the "multi-layered structure" or simply "multi-layer" can include about 100 alternating layers of molybdenum and silicon, each of the component layers being only about a few nanometers thick. Neither silicon nor molybdenum are normally soft materials. Therefore, according to embodiments of the present invention these materials can be locally melted together at desired contact spots to transform the soft multi-layer structure into a harder, uniform layer of alloyed material. Purely for convenience, we will henceforth refer to the process producing the local transformation of the multi-layer into a harder substance as "localized heat treatment".

In some embodiments, it may not be necessary to completely melt the multi-layer in order to achieve the desired hardness. This is because it is known that heat causes each material in the multi-layer to quickly diffuse into the other(s), thus forming a more homogeneous layer. This may occur even at temperatures well below the melting point of any of the multi-layer components. Hence, it will be apparent that localized heat treatment can also be applied in order to transform the multi-layer into a homogeneous layer by inter-diffusion instead of melting.

In other embodiments, deposition and diffusion of foreign substances on a layer can be used to strengthen the layer. Therefore, localized heating of the contact area in the presence of foreign substances with the intention of adding such substances to the layer is performed as the heat treatment process.

Figure 8:
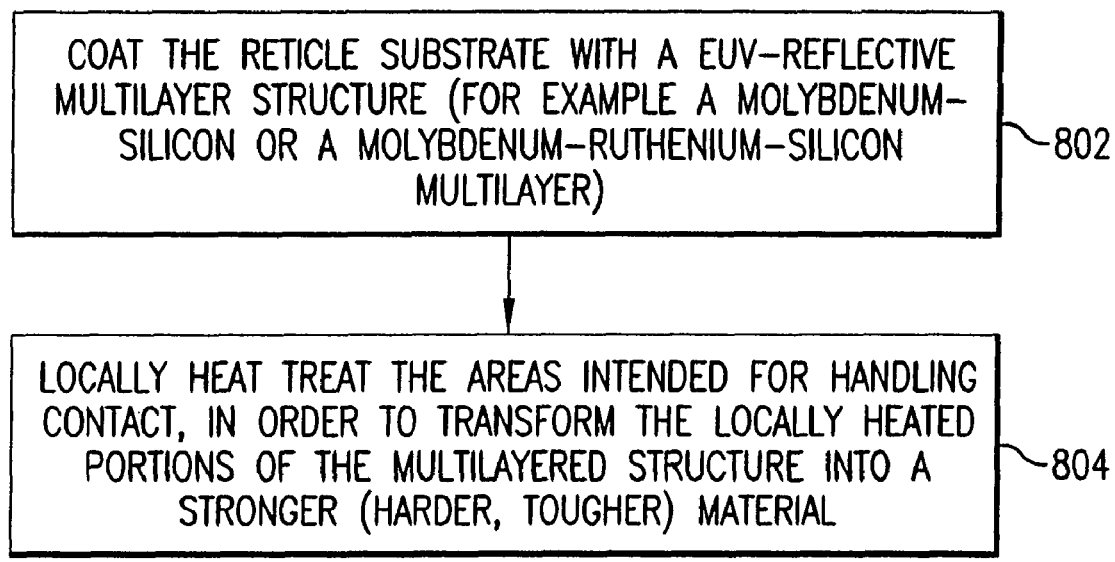
FIG. 8 is a method of reinforcement for areas in the reticle, according to an embodiment of the present invention.

FIG. 8 shows a flowchart depicting a method 800 according to embodiments of the present invention. Method 800 can be used for reinforcing areas in a reticle intended for handling contact by locally transforming a multi-layer-structured EUV-reflective coating. In step 802, an operation to coat the reticle substrate with an EUV-reflective multi-layer structure (molybdenum-silicon or molybdenum-ruthenium-silicon multi-layer, as is the present state of the art) is performed. In step 804, an operation to locally heat treat the areas intended for handling contact, in order to transform the locally heated portions of the multi-layered structure into a stronger (harder, tougher) material is performed.

In an embodiment, step 804 can be performed, for example, by focusing a powerful laser beam onto the designated areas of the reticle, possibly in the presence of chemical substances, comprising reactive agents and catalysts. Other types of radiative energy could be substituted for the laser beam of the example. Other localized heating methods such as for example inductive heating using a radio-frequency electromagnetic field could also be used.

The low thermal conductivity of typical EUV reticle substrate materials and of the multi-layer itself facilitate localizing the multi-layer transformation exclusively to the desired areas. This can be done without much fear of unintentionally altering the EUV-reflective material within or near the patterned field of the reticle. The multi-layer structure should remain intact in order to retain its unique optical properties. Placement of the contact areas at the corners of reticle 1 as suggested elsewhere in this disclosure maximizes their distance to the field, therefore making the effect of locally heat treating the contact areas most negligible as far as the optical characteristics of the reticle's patterned field are concerned.

Substantially Flat Reticle Cover

Figure 9:
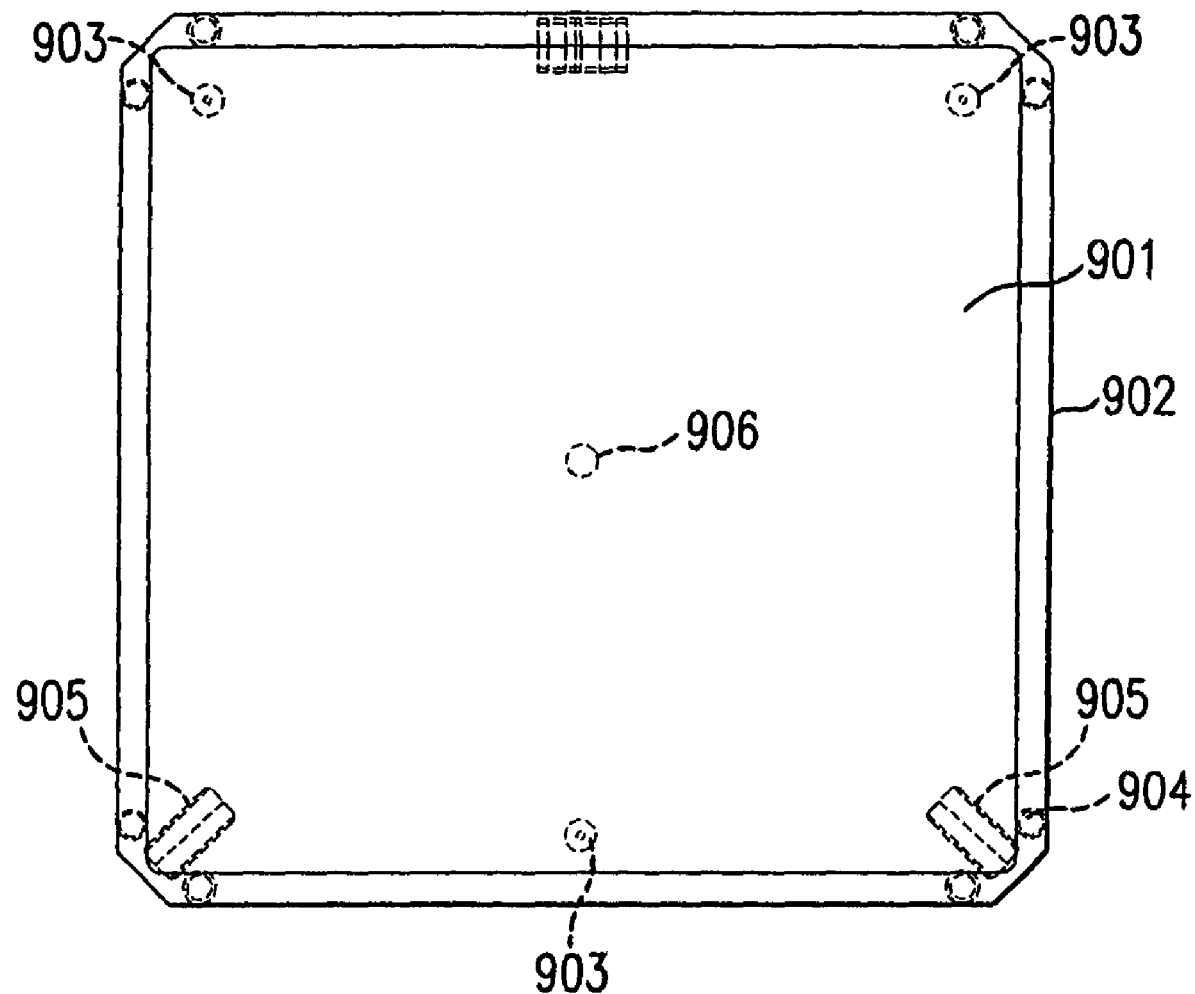
FIGS. 9-10 show a top and a bottom view, respectively, of an example reticle cover according to embodiments of the present invention.
Figure 10:
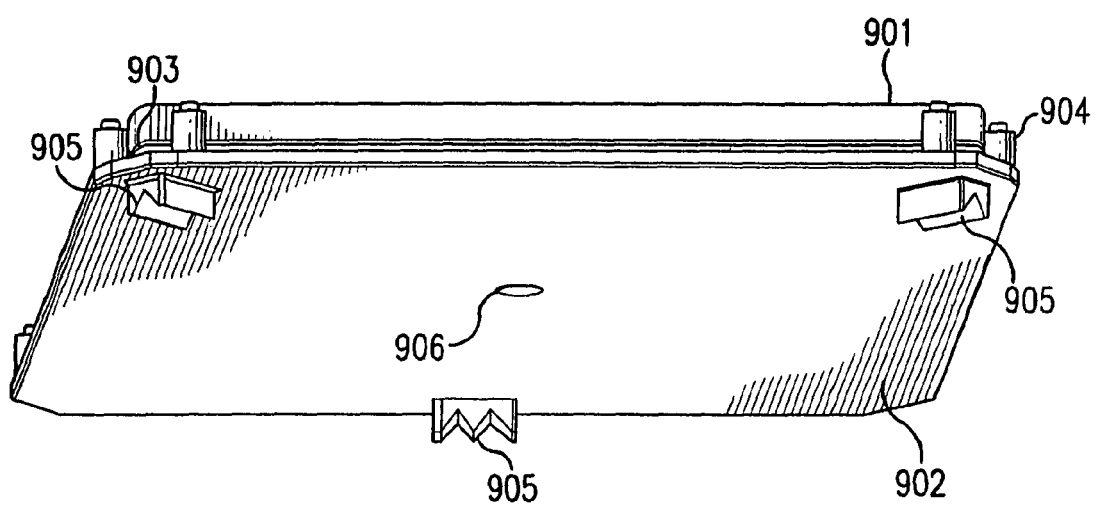
Figure 11:
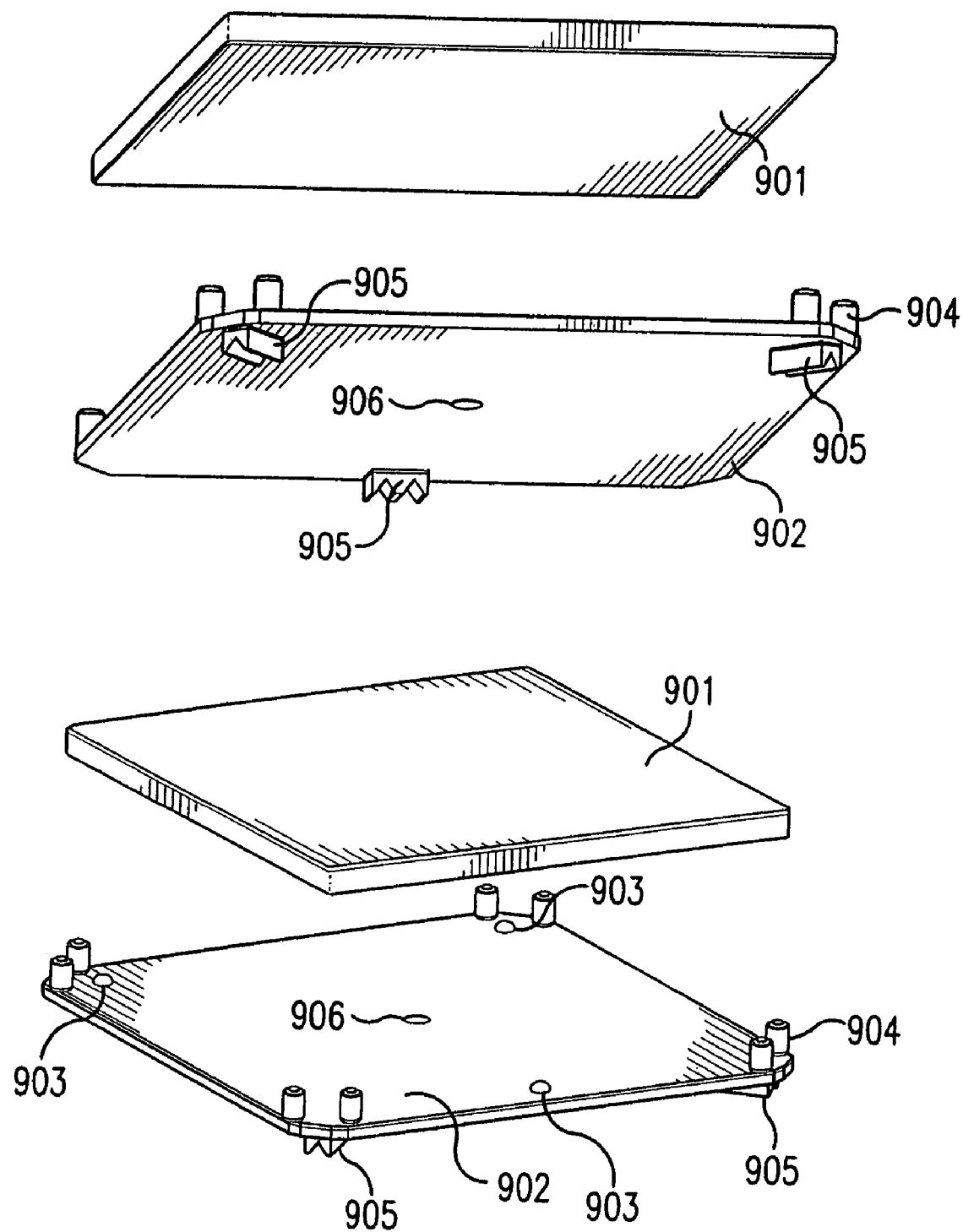
FIG. 11 shows exploded views of the reticle cover of FIGS. 9-10.

FIGS. 9-11 show a reticle cover 902 according to embodiments of the present invention. Reticle cover 902, which is removable during predetermined events, protects a reticle (e.g., a mask) 901. Reticle 901, which can be transparent to certain wavelengths of light, comprises: support pads or spacers 903; nesting pins 904; kinematic locators (e.g., mask locators) 905; and a hole 906. Hole 906 can be used to allow injection of a pressurized gas sweep between cover 902 and reticle 901 and can comprise a gas filter. Various materials can be used for making pads 903 and pins 904, such that they do not damage reticle 901 or shed particles when making or braking contact with it. Because some clearance is may be required between the reticle 901 and the nesting pins 904 for removing the cover 902, the reticle may slide a small amount with respect to the cover 902. An improvement over the embodiments described above is that cover 902 is substantially flat. By utilizing the substantially flat design less liquids are trapped during cleaning because there are no pockets or cavities that can trap the liquid. Thus, cover 902 is easy to clean or "superclean." In some embodiments, ultrasonic cleaning in a bath, rinsing, and spin drying cleans cover 902. Thus, in contrast to conventional, complex covers that were very difficult to clean because of their configuration, cover 902 is very easy to clean.

Double Wrapped Reticle Box (e.g., Reticle Pod)

Figure 12:
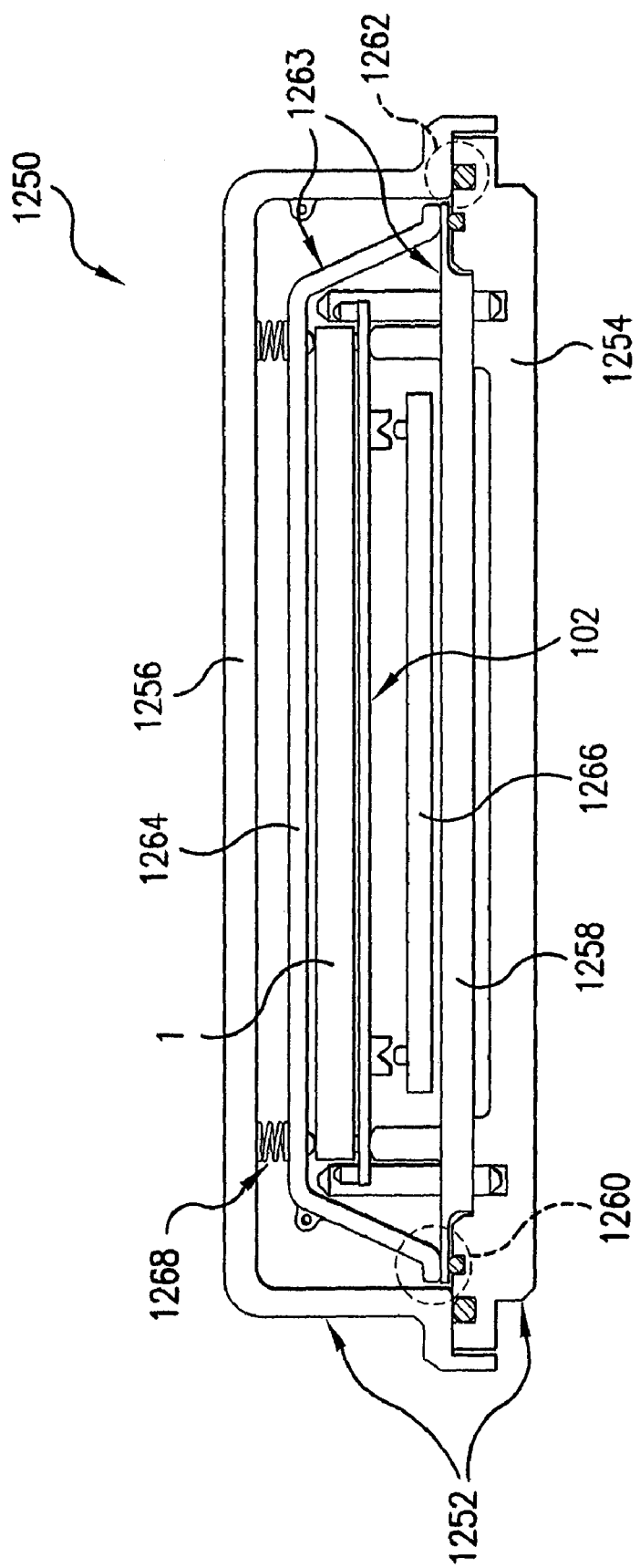
FIG. 12 shows a double wrap pod concept according to embodiments of the present invention.
Figure 13:
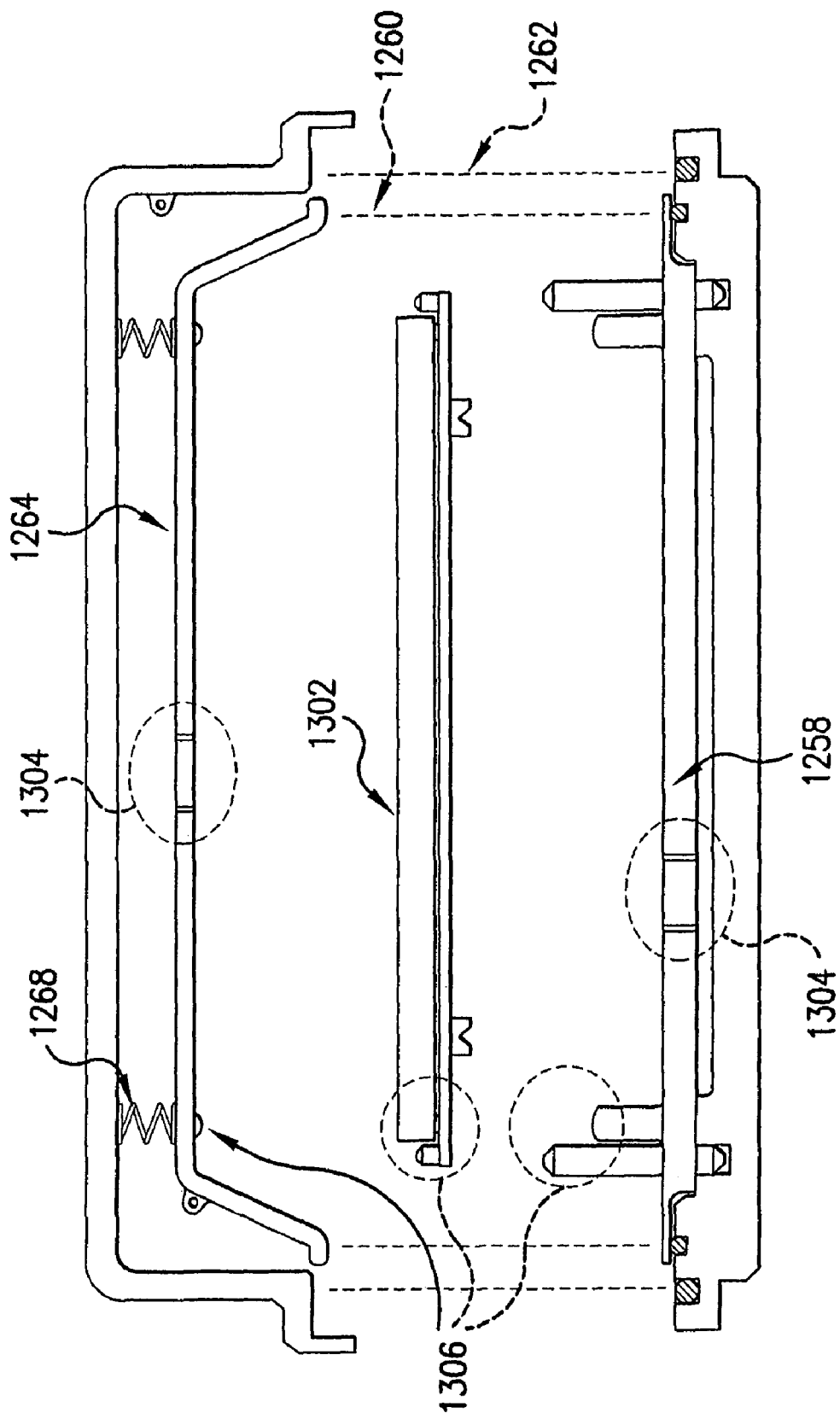
FIG. 13 shows an exploded view of the double wrap pod in FIG. 12.
Figure 17:
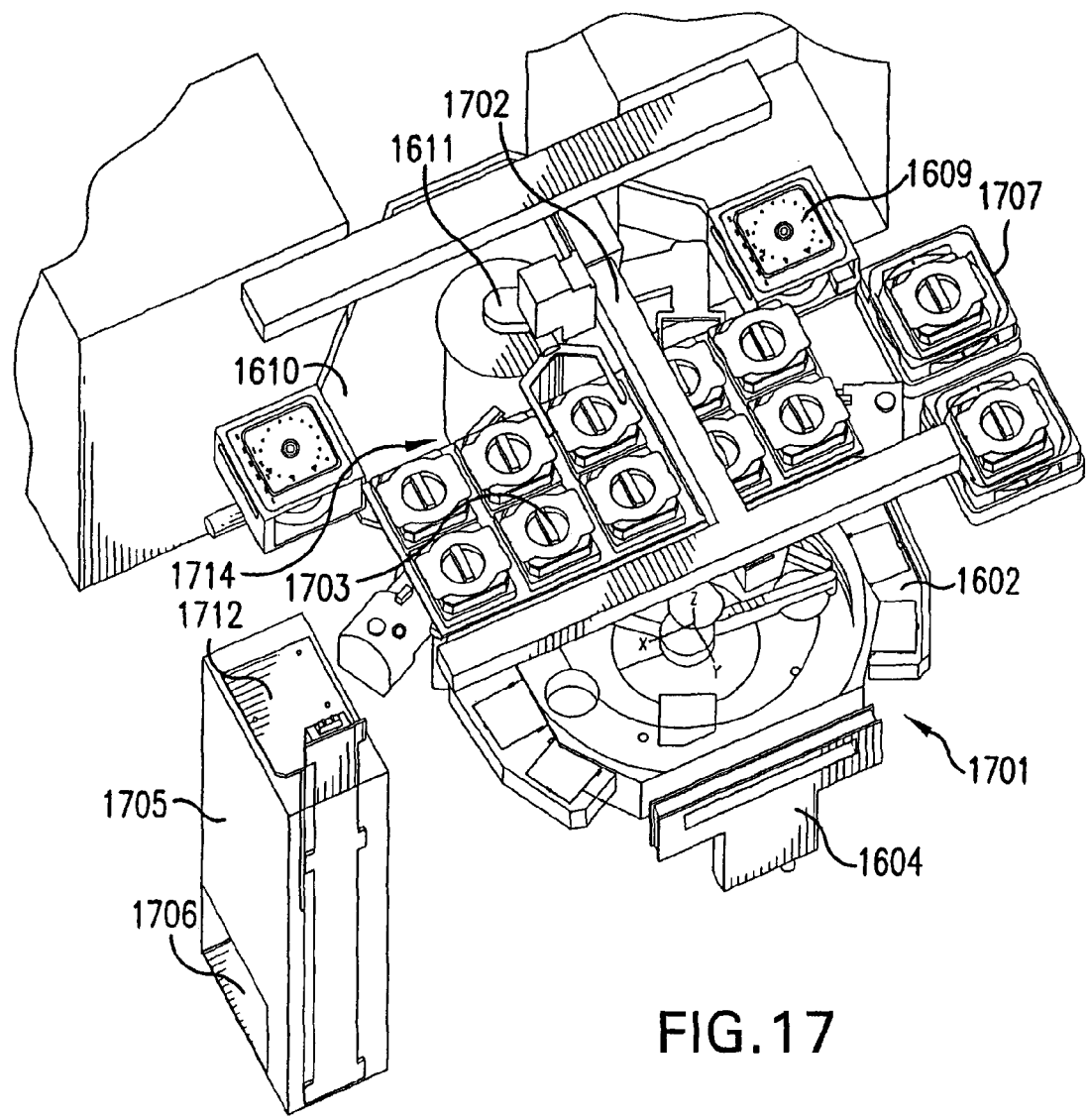
FIG. 17 shows an entire reticle handler according to embodiments of the present invention.

FIGS. 12-13 show a side and an exploded view, respectively, of a reticle box or pod 1250 (hereinafter, both are referred to as "pod"), according to embodiments of the present invention. More features of an example pod 1250 are shown in FIG. 17, discussed in detail below. The pod 1250 includes a possibly gas tight outer box 1252 having a base 1254 secured to a cover or lid 1256, which may be secured via a latch (not shown). A plate 1258, similar to the cover 902 above, can be substantially flat with no holes or cavities, which reduces production of particles and makes cleaning of plate 1258 easier. Also, particle generation can be further reduced by not requiring screws, or the like. A particle sealing device 1260 (e.g., an inner or first wrap) can be used to protect reticle 1 against particles and a gas sealing device 1262 (e.g., an outer or second wrap) can be used to make the outer box 1252 gas tight, which protects the inner or first wrap 1263 against molecular contaminants. The particle sealing device 1260 engages before the gas sealing device 1262 when the pod 1250 closes, and disengages after the gas sealing device 1262 when the pod 1250 can be opened. This can be in contrast to conventional systems that lack both a gas sealing device, because they do not use vacuum, and a particle sealing device.

The outer box 1252 secures inside a gas-permeable inner capsule 1263, which protects against particulate contaminants and has detachable parts for easy cleaning. The inner capsule 1263 includes a dome 1264 (e.g., a Pyrex® glass dome) which can have thin walls (e.g. 2 mm) coupled to a plate 1266 (e.g., made from or coated with polyimide, ESD grade polyetherimide, or the like). A reticle 1 and reticle cover 102 (e.g., made from Pyrex® glass, or the like) are positioned inside the inner capsule 1263, which can interact with a robot gripper (not shown). A device 1268 (e.g., springs, or the like) can be used to couple the dome 1264 to the lid 1256 and to apply restraining pressure to the inner capsule 1263 for immobilizing the reticle 1 during transportation. This can also compress the particle sealing device 1260. A surface 1302 of the reticle 1 can be glass, Chromium-plated (e.g., Cr-plated), or otherwise plated with a durable material. During use, the cover or lid 1256 of the pod 1250 are removed to access the reticle 1. A filtered passage 1304 can connect the volume included between the dome 1264 and the plate 1266 to the remaining volume included within the pod 1250, allowing gas to flow between the two volumes, but preventing particle flow. An example of a filtered passage 1304 can be a hole through a wall of the dome 1264 covered with a membrane gas filter, or the like. Another example can be a hole through the plate 1258 plugged with a sintered powder metal gas filter, or the like. It can be to be appreciated other locations and filtering devices can be used, as may be known in the art. Alignment devices 1306 can have polyimide coated contact surfaces.

The above example materials used to manufacture the various parts of the pod 1250 reduce generation of particles. It can be to be appreciated that these materials are only being used as preferred examples, and other known materials can also be used.

The pod 1250 can be opened in two stages, as will be described in more detail below with regards to the methodology of using the systems. First, the lid 1256 lifts a predetermined amount to break the gas seal caused by the gas sealing device 1262. This causes gas to flow into the pod 1250, and particles to be transported with the gas. However, particles cannot reach the reticle 1 directly.

Gas flows through the filtered passage 1304, equalizing the pressure inside the dome 1264 to the ambient pressure. Second, as the lid 1256 can be continuously lifted, the dome 1264 can be lifted off the plate 1266. After the pressure inside the dome 1264 has been equalized to ambient pressure in the previous step, there can be no significant flow of gas or particles in or out of the dome 1264 when it is lifted off. In these embodiments, either the dome 1264, the plate 1266, or both are permeable to gas, i.e., they allow the flow of gas to eliminate a pressure difference between inside and outside the dome 1264.

Loadlock

Figure 14:
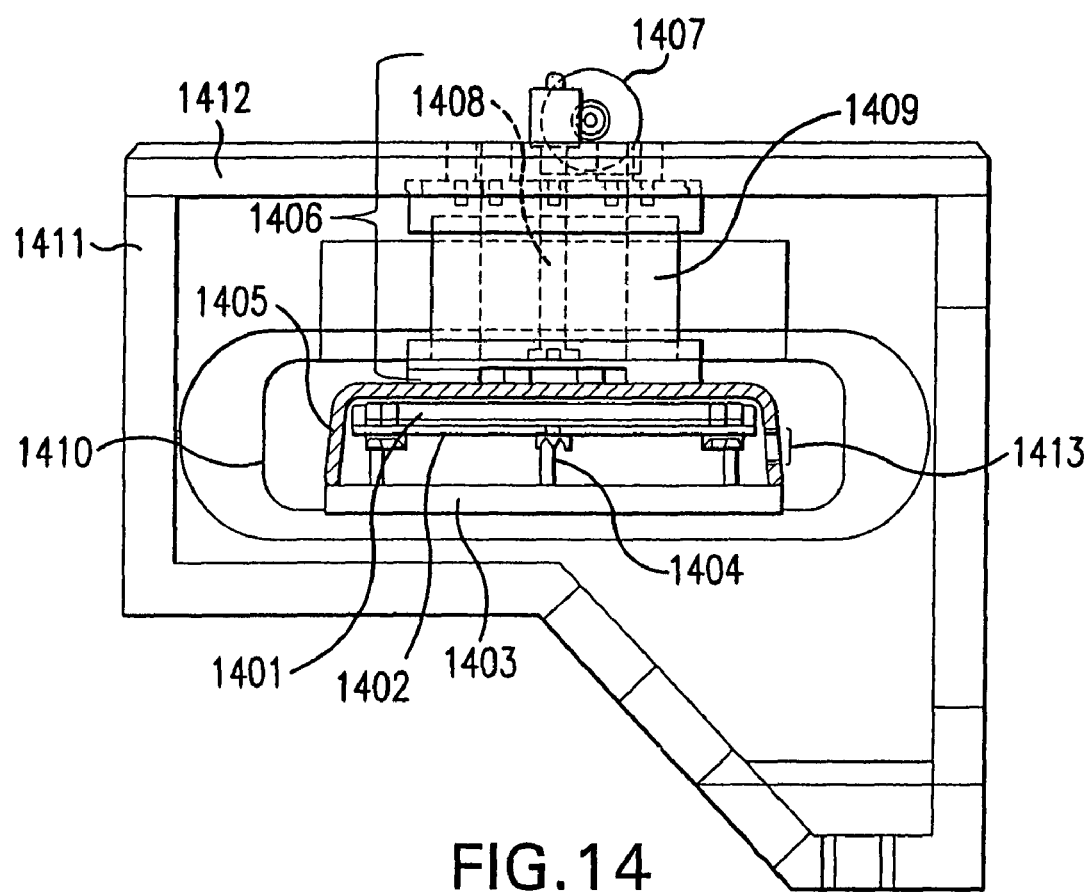
FIG. 14 shows a loadlock according to embodiments of the present invention.
Figure 15:
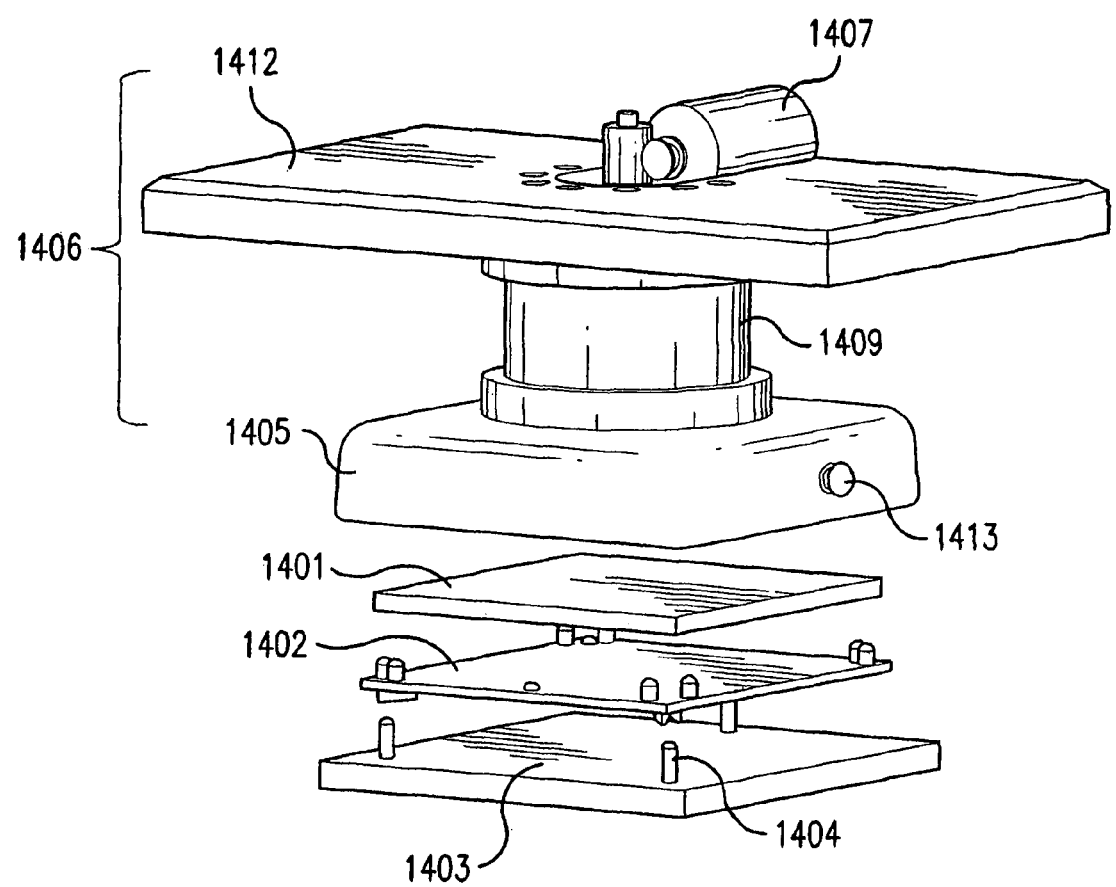
FIG. 15 shows an exploded view of the loadlock in FIG. 14.

FIGS. 14-15 show side and exploded views, respectively, of a loadlock according to embodiments of the present invention. In one embodiment, a reticle 1401 (that can be on top of support pins 1404) and a reticle cover 1402 are positioned between a base 1403 and a dome 1405. A dome removing device (e.g., a dome lifter) 1406 comprises a motor 1407, a lead screw 1408, and bellows 1409. The loadlock also comprises an opening 1410 for atmospheric side and vacuum side gate valves. All of the above parts are positioned inside an enclosure formed by a bottom section (e.g., a vacuum shell) 1411 and a top section (e.g., a vacuum shell roof) 1412. The loadlock can also comprise a seal seat substantially conforming to an open end of the dome of the pod and/or a particle sealing device for preventing particle flow between the dome and the seat. The loadlock can further comprise a filtered passage 1413 that equalizes the gas pressure inside the dome with the gas pressure outside the dome (e.g., a hole through the dome wall covered with a membrane gas filter) and a device (e.g., a sensor or detector) for detecting airborne or gas borne (hereinafter, both are referred to as "airborne") particles in the loadlock.

Typically, loadlocks are quite dirty, mainly because of gate valves that seal to pump down or vent the loadlock. Each time the seal is made or broken, particles are created that become air or gas borne. Also, the gate valves are complicated, mechanical assemblies with many moving, rubbing, friction causing parts and lubricants. This causes dirt to accumulate inside the loadlock. During venting of a loadlock, gas flows into the loadlock and equalizes the pressure to atmospheric pressure, which causes movement of particles. Also, when pumping down the loadlock, gas flows out of the loadlock, which causes movement of particles. Therefore, by using encapsulation of the reticle inside the dome and plate, according to embodiments of the present invention, the reticle is protected from the particles.

Reticle Handler

Figure 16:
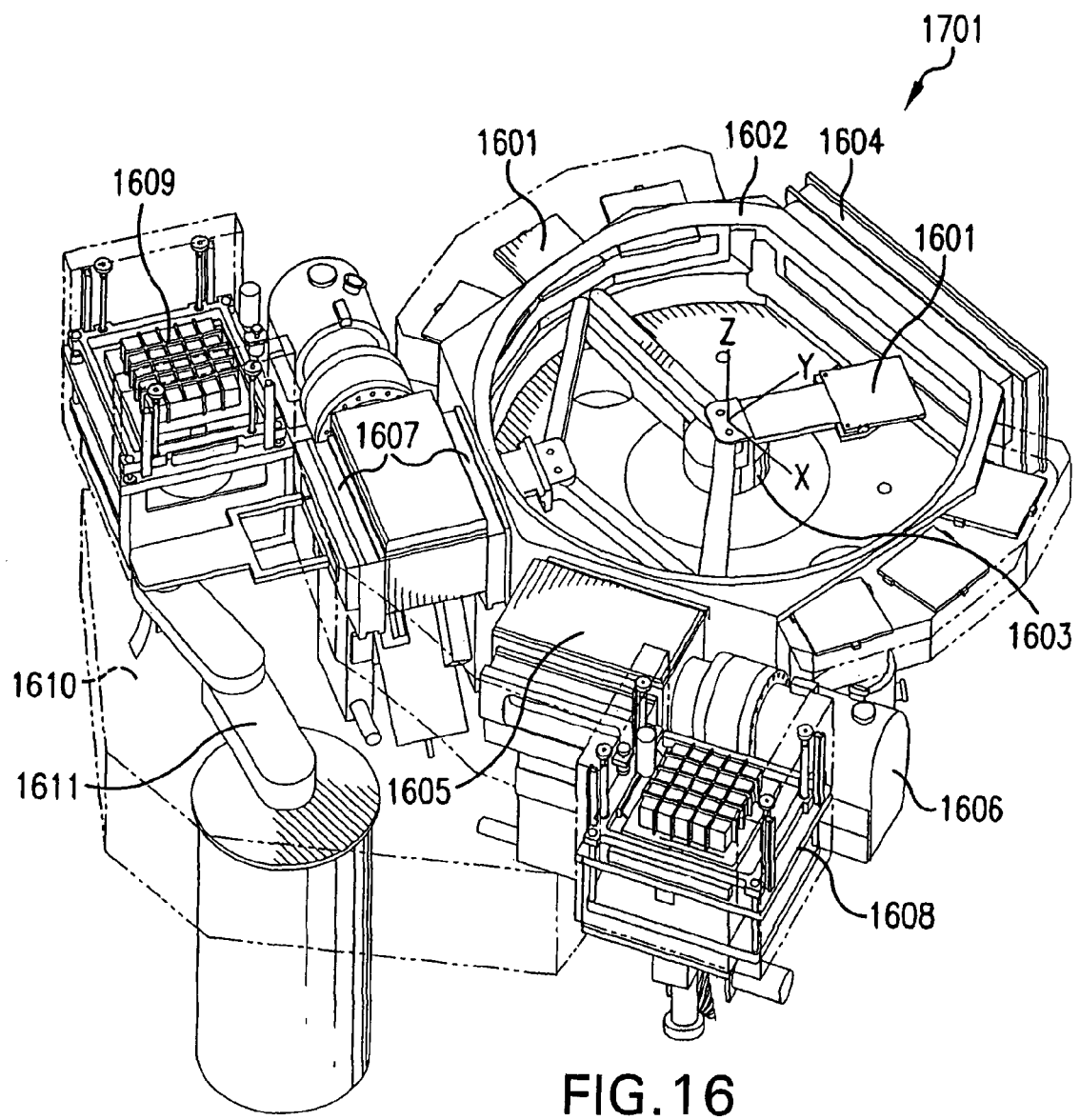
FIG. 16 shows a reticle handler core according to embodiments of the present invention.

FIGS. 16-17 show a reticle handler core 1701 and a reticle handling system, respectively, according to embodiments of the present invention. The reticle handling system comprises a core environment (e.g., a vacuum and a mini environment) and an atmospheric (air) environment. The core environment is substantially located in reticle handler core 1701. With reference to FIG. 16, reticle handler core 1701 comprises a reticle 1601 in a vacuum chamber 1602. Reticle 1601 is moved through vacuum chamber 1602 via a vacuum robot 1603, which can have two arms. Reticle core 1701 also comprises a gate valve 1604 between vacuum chamber 1602 and a process chamber. Reticle core 1701 further comprises a loadlock 1605 having a loadlock turbo pump 1606 and loadlock gate valves 1607. Reticle core 1701 still further comprises a de-podder 1608 that opens a pod 1609. Openings in the loadlock and the de-podder connect to a clean gas mini-environment chamber 1610 and are accessible via a mini-environment robot 1611.

During operation, a reticle (not visible in this figure) is removed from an open pod 1609 by mini-environment robot 1611. The reticle is then placed inside loadlock 1605 through gate valve 1607. The loadlock is pumped down and the reticle is removed from the loadlock by vacuum robot 1603. Reticle 1601 is transported through vacuum chamber 1602 using robot 1603 and placed through gate valve 1604 inside a process chamber (not shown in this figure). After processing, the vacuum robot 1603 removes the reticle from the process chamber through gate valve 1604 and places it inside loadlock 1605 through gate valve 1607. The loadlock is then vented and reticle 1601 is passed through loadlock 1605, from right to left, before entering mini-environment chamber 1610. Mini-environment chamber 1610 can be filled with clean, filtered, and/or dry gas (e.g., dry nitrogen). Mini-environment robot 1611 then removes the reticle from the loadlock and places it in open pod 1609 located in de-podder 1608. The de-podder then closes the pod.

With reference now to FIG. 17, the reticle handler system also comprises an air or atmospheric environment having an atmospheric robot 1702 used to move pods 1703. Pods 1703 can be stored in a pod storage rack, as shown. Pods 1703 are typically handled using a bar or handle shown across their top portions that an operator grabs and using various parts of its housing that the various robots engage. A pod elevator 1705, which is shown in an up position, elevates pods 1703 placed by an operator in input location 1706 to the handling plane of robot 1702. Alternatively, pods 1703 can be delivered to the tool by an overhead track (not shown) which places pods 1703 in locations 1707 which can be reached directly by robot 1702. Robot 1702 is capable of moving pods 1703 between upper elevator stop 1712, pod storage rack 1714, overhead locations 1707, and/or de-podders 1609. Once a pod 1703 is placed in the de-podders 1609, reticle handler core 1701 opens the pod 1703 and processes the reticle 1601, as described in detail above. Similarly, after the reticle 1601 has been processed, reticle handler core 1701 replaces the reticle 1601 in the pod 1703 and closes the pod 1703. Therefore, the work is divided between the reticle handler core 1701, which handles reticles 1601 outside pods 1703, and the atmospheric portion of the handler, which only handles pods 1703.

These two subsystems transfer handling of the reticle 1601 to each other via the de-podders 1609. The reticle handler core 1701, which is described in reference to FIG. 16, is also visible in this figure (FIG. 17) and lies below the atmospheric robot 1702. To help orient the reader, vacuum chamber 1602, a mini-environment chamber 1610, de-podders 1609, and a mini-environment robot 1611 are pointed out. There can be storage capability in both the atmospheric environment and the core environment.

In some embodiments, the filtered air environment can also comprise an identification station for reading: an ID mark encoded on pods 1703, a smart tag attached to pods 1703, or the like.

In some embodiments, the gas mini-environment can comprise: (a) an identification station for reading an ID mark encoded on a mask; (b) a thermal conditioning station for equalizing the temperature of an incoming mask to a pre-determined processing temperature; (c) a mask inspection station, for detecting contaminants on at least one surface of a mask, a mask cleaning station; (d) for removing surface contaminants from at least one surface of a mask, and/or (e) a mask orienting station, for precisely orienting a mask relative to the machine. Also, in some embodiments, the mini-environment is purged with a gas selected from the group comprising: filtered dry air, synthetic air, a mix of dry nitrogen and dry oxygen, and/or dry nitrogen, or other gases.

In some embodiments, the vacuum portion comprises: (a) an identification station for reading an ID mark encoded on a mask; (b) a library for temporarily storing at least one mask; (c) a thermal conditioning station for equalizing the temperature of an incoming mask to a pre-determined processing temperature; (d) a mask inspection station; (e) for detecting contaminants on at least one surface of a mask; (f) a mask cleaning station, for removing surface contaminants from at least one surface of a mask; (g) a mask orienting station, for precisely orienting a mask relative to the machine; and/or (h) a processing station, for processing at least one mask. In some embodiments, the processing station is for photolithographically reproducing a pattern on a surface of a mask onto a photoresist-coated wafer, using light. In some embodiments, the wavelength of the light corresponds to an extreme ultraviolet (EUV) portion of the spectrum and is between 10 and 15 nanometers, preferably 13 nm.

Methodology

Figure 18:
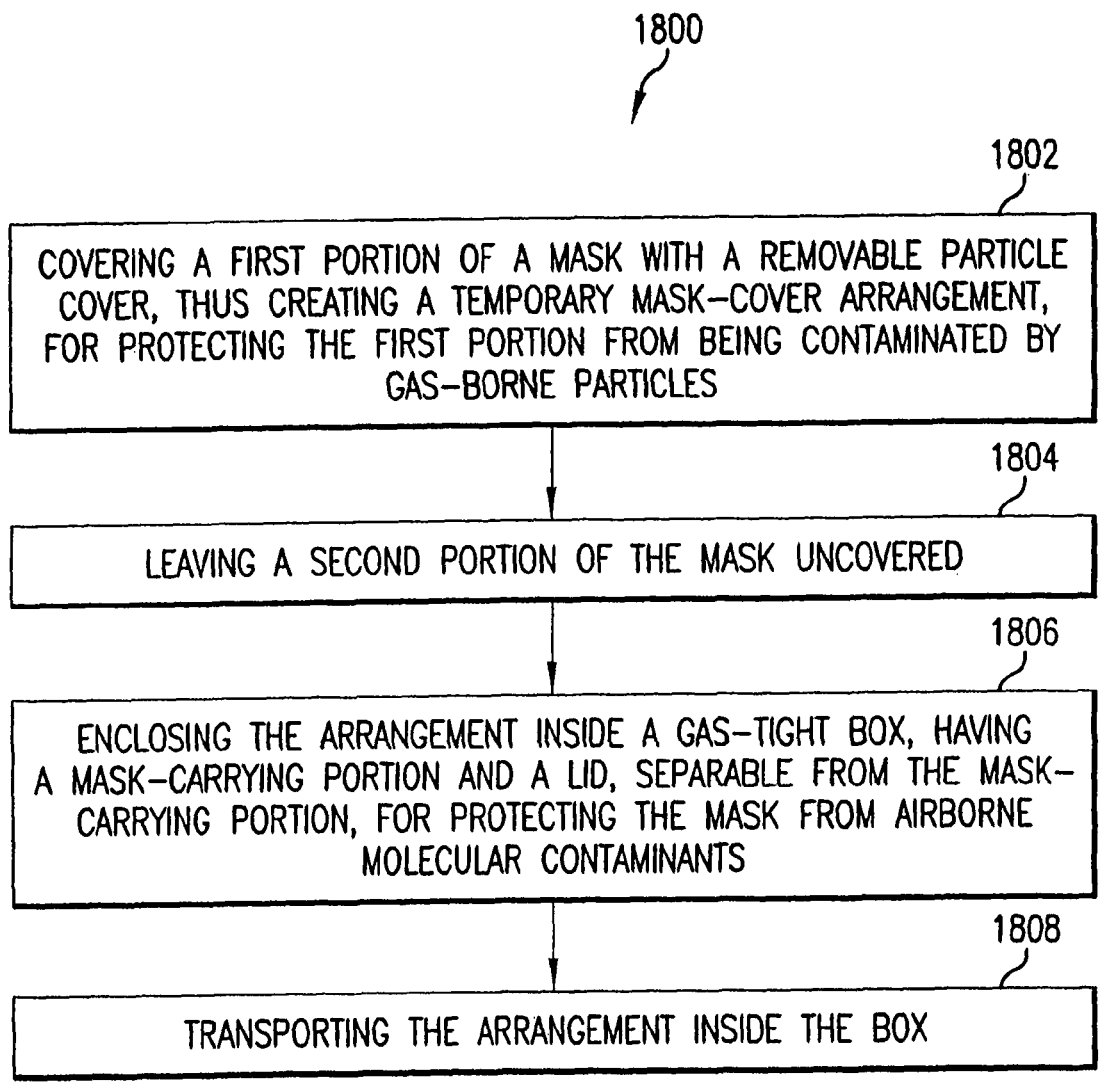
FIG. 18 shows a flowchart depicting a method for transporting a mask according to embodiments of the present invention.

FIG. 18 shows a flowchart depicting a method 1800 for transporting a mask, according to embodiments of the present invention. At step 1802, a first portion of a mask is covered with a removable particle cover. This creates a temporary mask-cover arrangement that protects the first portion from being contaminated by airborne particles. At step 1804, a second portion of the mask is left uncovered. At step 1806, the arrangement is enclosed inside a gas-tight box. The box can have a mask-carrying portion and a lid, separable from the mask-carrying portion, for protecting the mask from airborne molecular contaminants. At step 1806, the arrangement inside the box is transported.

Figure 19A:
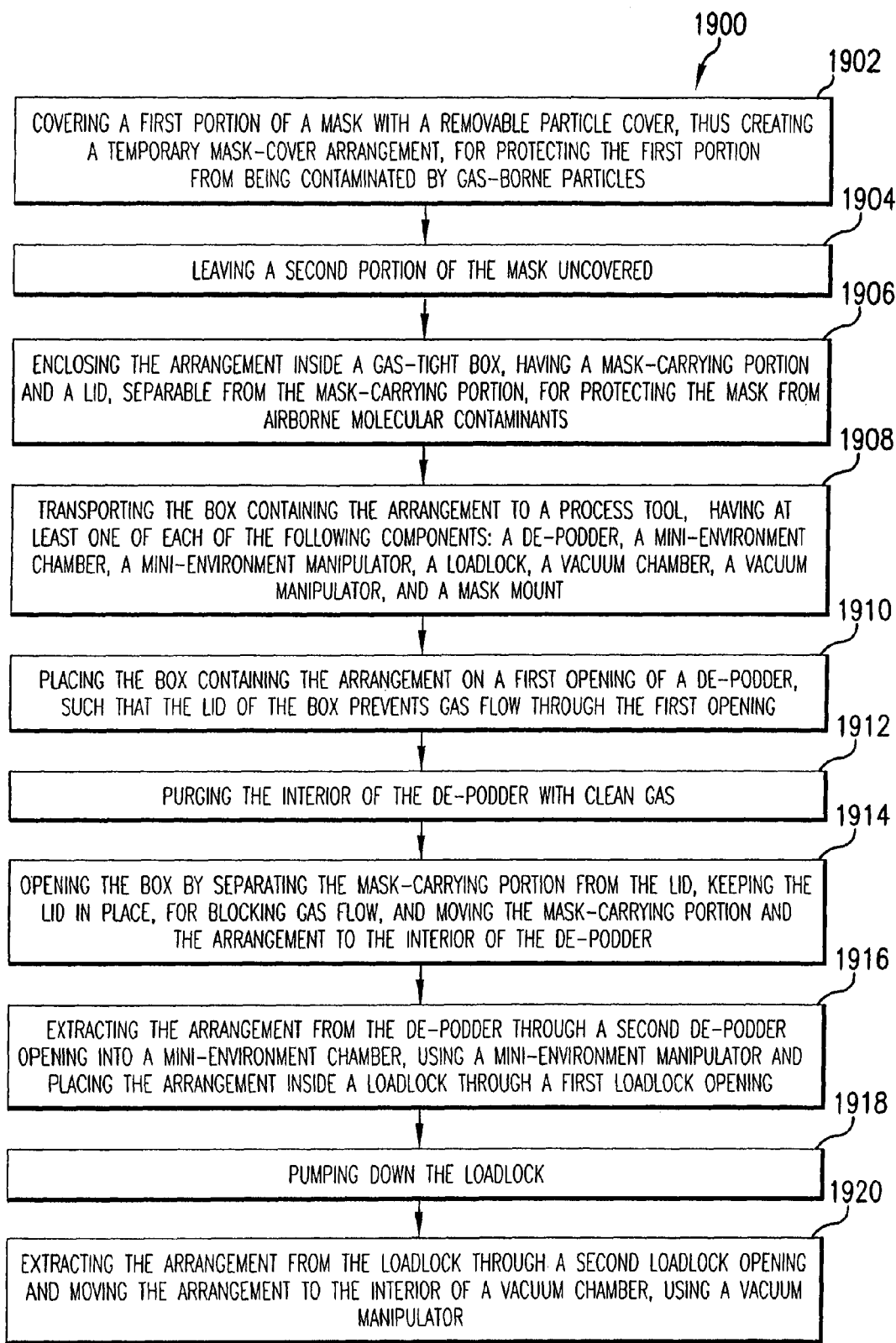
FIGS. 19A and 19B show a flowchart depicting a method for transporting, handling and processing a mask according to embodiments of the present invention.
Figure 19B:
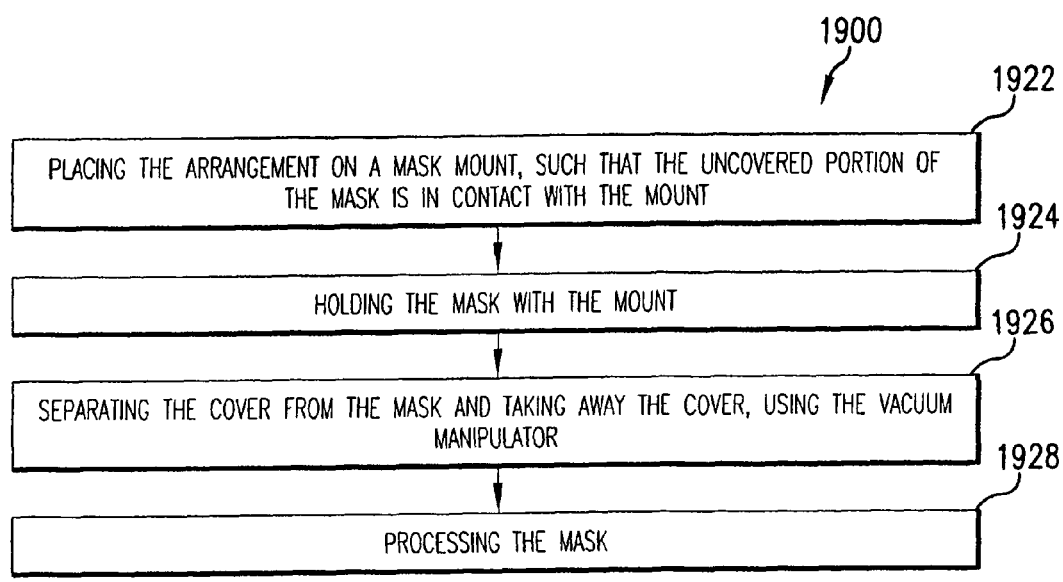

FIGS. 19A and 19B show two portions of a flowchart depicting a method 1900 for transporting, handling, and processing a mask according to embodiments of the present invention. At step 1902, a first portion of a mask is covered with a removable particle cover. This creates a temporary mask-cover arrangement to protect the first portion from being contaminated by gas-borne particles. At step 1904, a second portion of the mask is left uncovered. At step 1906, the arrangement is enclosed inside a gas-tight box. The box can have a mask-carrying portion and a lid, separable from the mask-carrying portion, for protecting the mask from airborne molecular contaminants.

At step 1908, the box containing the arrangement is transported to a process tool. The process tool can have at least one of each of the following components: a de-podder, a mini-environment chamber, a mini-environment manipulator, a loadlock, a vacuum chamber, a vacuum manipulator, and a mask mount. At step 1910, the box containing the arrangement is placed on a first opening of a de-podder, such that the lid of the box prevents gas flow through the first opening. At step 1912, the interior of the de-podder is purged with clean gas. At step 1914, the box is opened by separating the mask-carrying portion from the lid, keeping the lid in place, for blocking gas flow, and moving the mask-carrying portion and the arrangement to the interior of the de-podder. At step 1916, the arrangement is extracted from the de-podder through a second de-podder opening into a mini-environment chamber, using a mini-environment manipulator and placing the arrangement inside a loadlock through a first loadlock opening. At step 1918, the loadlock is pumped down. At step 1920, the arrangement is extracted from the loadlock through a second loadlock opening and moved to the interior of a vacuum chamber using a vacuum manipulator. At step 1922, the arrangement is placed on a mask mount, such that the uncovered portion of the mask is in contact with the mount. At step 1924, the mount holds the mask. At step 1926, the cover is separated from the mask and removed or relocated using the vacuum manipulator. At step 1928, the mask is processed.

Figure 20:
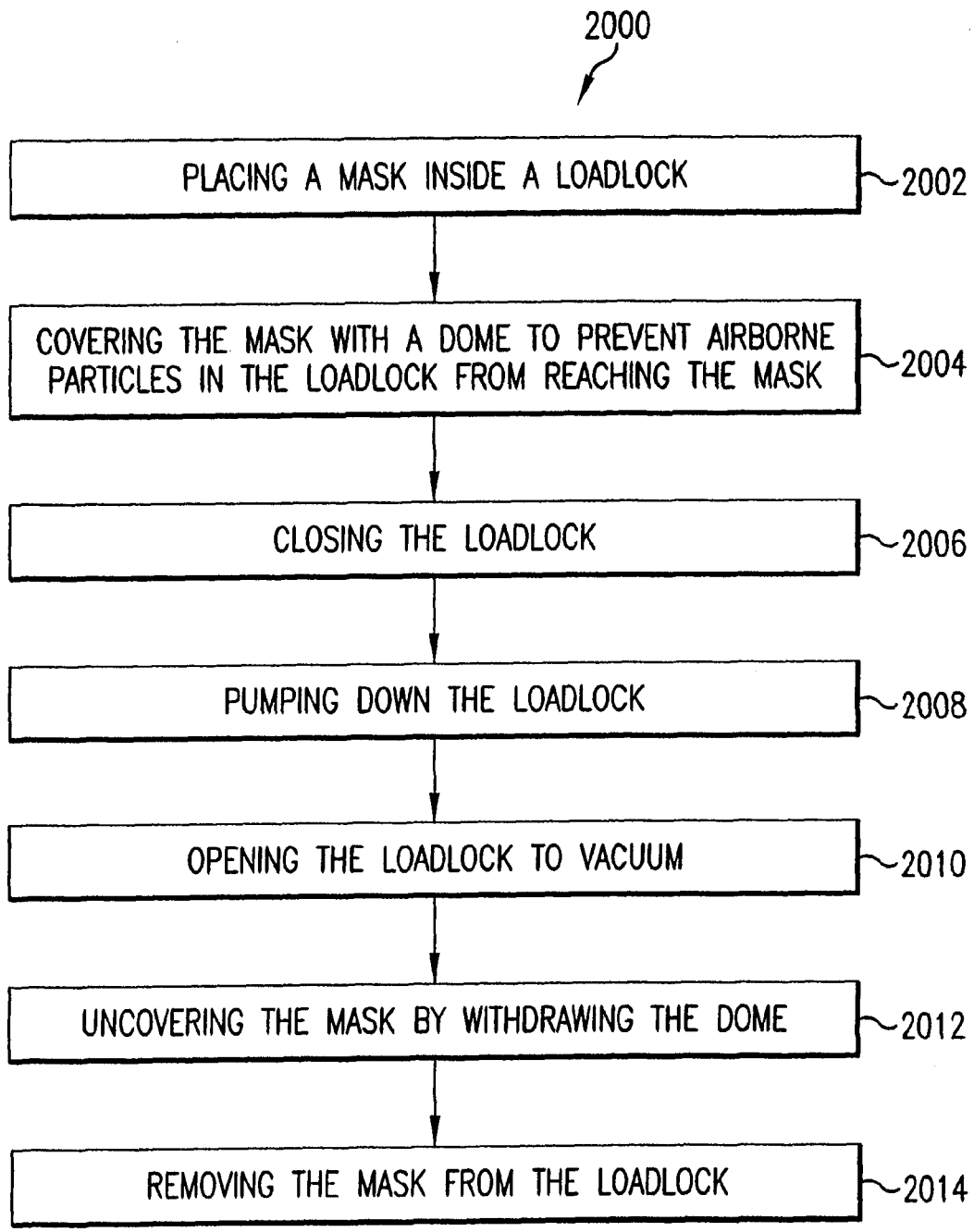
FIG. 20 shows a flowchart depicting a method for transitioning a mask from atmospheric pressure to vacuum in a loadlock according to embodiments of the present invention.

FIG. 20 shows a flow chart depicting a method 2000 for transitioning a mask from atmospheric pressure to vacuum in a loadlock. In step 2002, a mask is placed inside a loadlock. At step 2004, the mask is covered with a dome to prevent airborne particles in the loadlock from reaching the mask. At step 2006, the loadlock is closed. At step 2008, the loadlock is pumped down. At step 2010, the loadlock is opened to vacuum. At step 2012, the mask is uncovered by withdrawing the dome. At step 2014, the mask is removed from the loadlock.

Figure 21:
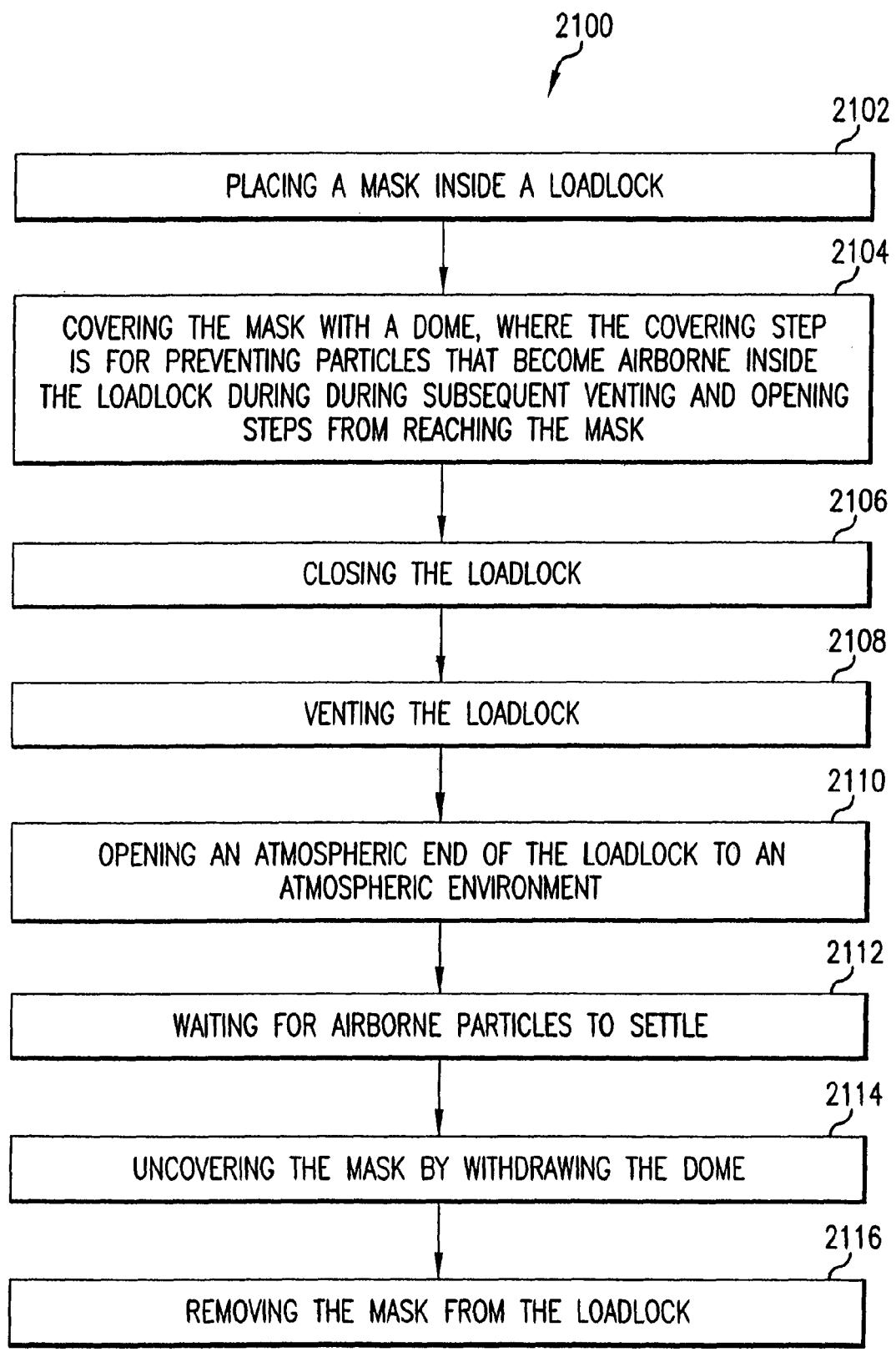
FIG. 21 shows a flowchart depicting a method for transitioning a mask from vacuum to atmospheric pressure in a loadlock according to embodiments of the present invention.

FIG. 21 shows a flowchart depicting a method 2100 for transitioning a mask from vacuum to atmospheric pressure in a loadlock. In step 2102, a mask is placed inside a loadlock. In step 2104, the mask is covered with a dome. The covering step 2104 is for preventing particles that become airborne inside the loadlock during subsequent venting and opening steps from reaching the mask. In step 2106, the loadlock is closed. In step 2108, the loadlock is vented. In step 2110, an atmospheric end of the loadlock is opened to an atmospheric environment. In step 2112, airborne particles settle. In step 2114, the mask is uncovered by withdrawing the dome. In step 2116, the mask is removed from the loadlock.

Figure 22:
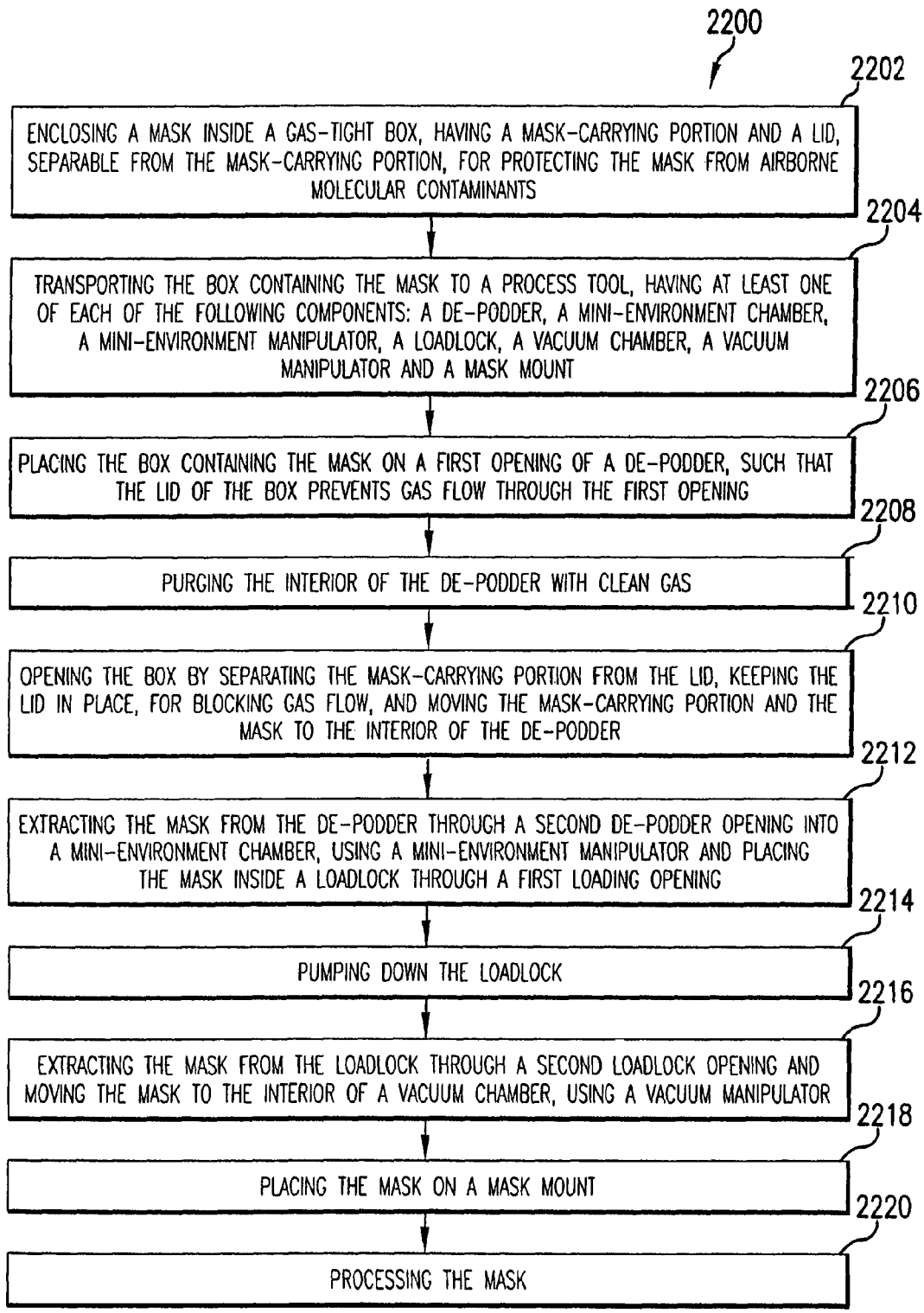
FIG. 22 shows a flowchart depicting a method for transporting, handling and processing a mask according to embodiments of the present invention.

FIG. 22 shows a flowchart depicting a method 2200 for transporting, handling, and processing a mask. In step 2202, a mask is enclosed inside a gas-tight box, having a mask-carrying portion and a lid, separable from the mask-carrying portion, for protecting the mask from airborne molecular contaminants. In step 2204, the box containing the mask is transported to a process tool, having at least one of each of the following components: (a) a de-podder; (b) a mini-environment chamber; (c) a mini-environment manipulator; (d) a loadlock; (e) a vacuum chamber; (f) a vacuum manipulator and a mask mount. In step 2206, the box containing the mask is placed on a first opening of a de-podder, such that the lid of the box prevents gas flow through the first opening. In step 2208, the interior of the de-podder is purged with clean gas (e.g., dry nitrogen). In step 2210, the box is opened by separating the mask-carrying portion from the lid, keeping the lid in place, for blocking gas flow, and moving the mask-carrying portion and the mask to the interior of the de-podder. In step 2212, the mask is extracted from the de-podder through a second de-podder opening into a mini-environment chamber, using a mini-environment manipulator and placing the mask inside a loadlock through a first loadlock opening. In step 2214, the loadlock is pumped down. In step 2216, the mask is extracted from the loadlock through a second loadlock opening and moving the mask to the interior of a vacuum chamber, using a vacuum manipulator. In step 2218, the mask is placed on a mask mount. In step 2220, the mask is processed.

In summary, during several of the above embodiments, a reticle encounters three environments: a pod environment (e.g., a purged dry gas mini-environment), a de-podder to loadlock environment (e.g., vacuum), and from loadlock to chuck environment. The reticle can be encapsulated during each environment transition. In some embodiments, a double wrap pod is used by: opening the pod, purging the de-podder, waiting for airflow to stabilize, opening the capsule, and extracting the reticle and/or cover from the capsule. In other embodiments, a special design loadlock with dome is used by: placing the reticle and/or the cover in a loadlock, covering the reticle with a dome, venting to purge the loadlock, waiting for airflow to stabilize, lifting the dome, and extracting the reticle and/or the cover from the loadlock. In further embodiments, particle settling is prevented on patterned areas without using a physical barrier by either controlling gas flow during pressure transitions or filtering gas flow (curtain/barrier) on reticle front side. In still further embodiments, the reticle is protected with a physical barrier impervious to particles using a gas-permeable cover or the reticle is stored inside pod with cover on, the reticle and cover are placed in a loadlock, the pressure transitioned with the cover on, and the cover removed once inside vacuum environment.

By using the above embodiments, particle generation is reduced even when using non-ideal materials for the various systems and parts of the systems. This is accomplished, in part, through using protective frames, covers, etc., and using edge handling schemes.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method, comprising:
    covering a first portion of a reticle with a removable particle cover assembly to form an arrangement that protects the first portion of the reticle from being contaminated, a portion of the removable particle cover assembly being moveable away from the reticle when the reticle is at an exposure position before exposure of the reticle;
    enclosing the arrangement inside a box formed by coupling a base to a lid separable from the base, the base supporting the reticle, the box protecting the reticle from contaminants; and
    transporting the arrangement inside the box.

2. The method of claim 1, further comprising:
    using a gas sealing device to prevent gas flow between the base and the lid; and
    using a latch to removably secure the lid to the base.

3. The method of claim 1, wherein the reticle comprises a reflective reticle.

4. A method, comprising:
    covering a first portion of a reticle with a removable particle cover assembly to form an arrangement that protects the first portion of the reticle from being contaminated, a portion of the removable particle cover assembly being moveable away from the reticle when the reticle is at an exposure position before exposure of the reticle;
    enclosing the arrangement inside a box formed by coupling a base to a lid, the base supporting the reticle, the box protecting the reticle from contaminants;
    transporting the arrangement inside the box;
    using a gas sealing device to prevent gas flow between the base and the lid;
    using a latch to removably secure the lid to the base;
    substantially preventing particles within the box from reaching the reticle using a dome at an interior side of the lid; and
    substantially preventing a flow of particles between the dome and the base using a particle sealing device.

5. The method of claim 4, wherein operations of the gas sealing device and the particle sealing device occur sequentially.

6. The method of claim 5, further comprising:
    using a device to couple the dome to the lid, the device including at least a spring that applies a compressive force on the particle sealing device as the lid approaches the base during closure of the box, wherein the particle sealing device is compressible.

7. The method of claim 6, further comprising:
    biasing the reticle against the base to immobilize the reticle during transportation using another spring coupled to an interior side of the dome.

8. The method of claim 4, wherein:
    when closing the box, the particle sealing device is at least partially engaged before the gas sealing device starts to compress; and
    when opening the box, the gas sealing device is substantially decompressed and separated from at least one of the lid and base before the particle sealing device starts to disengage.

9. The method of claim 4, further comprising:
    allowing gas to flow from the sealed cavity formed between the dome and the base to the remaining interior volume of the box, and back using a passage.

10. A method, comprising:
    covering a first portion of a reticle with a removable particle cover assembly to form an arrangement that protects the first portion of the reticle from being contaminated, a portion of the removable particle cover assembly being moveable away from the reticle when the reticle is at an exposure position before exposure of the reticle;
    enclosing the arrangement inside a box formed by coupling a base to a lid, the base supporting the reticle, the box protecting the reticle from contaminants;
    transporting the arrangement inside the box; and
    securing the removable particle cover assembly to a stage located at the exposure position.

11. A method, comprising:
    covering a first portion of a mask with a removable particle cover to form an arrangement that protects the first portion from being contaminated and that leaves a second portion of the mask uncovered;
    enclosing the arrangement inside a gas-tight box having a base coupled to a lid separable from the base, the base supporting the reticle, the box protecting the mask from contaminants; and
    transporting the arrangement inside the box.

12. The method of claim 11, wherein the mask comprises a reflective mask.

* * * * *